US005624774A

United States Patent [19]
Okino et al.

[11] Patent Number: 5,624,774
[45] Date of Patent: Apr. 29, 1997

[54] METHOD FOR TRANSFERRING PATTERNS WITH CHARGED PARTICLE BEAM

[75] Inventors: Teruaki Okino; Mamoru Nakasuji, both of Kanagawa-ken, Japan

[73] Assignee: Nikon Corporation, Tokyo, Japan

[21] Appl. No.: 490,579

[22] Filed: Jun. 15, 1995

[30] Foreign Application Priority Data

Jun. 16, 1994 [JP] Japan .................................. 6-134122
Jun. 24, 1994 [JP] Japan .................................. 6-143246

[51] Int. Cl.⁶ ........................................................ G03F 9/00
[52] U.S. Cl. ............................ 430/5; 430/296; 430/311; 430/312
[58] Field of Search ............................ 430/296, 5, 311, 430/312

[56] References Cited

U.S. PATENT DOCUMENTS

| | | |
|---|---|---|
| 5,079,112 | 1/1992 | Berger et al. . |
| 5,130,213 | 7/1992 | Berger et al. . |
| 5,227,269 | 7/1993 | Scott ...................................... 430/296 |
| 5,258,246 | 11/1993 | Berger et al. . |
| 5,260,151 | 11/1993 | Berger et al. . |
| 5,279,925 | 1/1994 | Berger et al. . |
| 5,347,592 | 9/1994 | Yasuda et al. . |

*Primary Examiner*—S. Rosasco
*Attorney, Agent, or Firm*—Armstrong, Westerman, Hattori, McLeland & Naughton

[57] ABSTRACT

A pattern to be transferred onto a predetermined area on a beam-sensitive substrate is divided into a plurality of small regions on a mask, projection of a charged particle beam covering each small region is repeated for all of the small regions, and pattern transfer positions are adjusted so that transfer areas corresponding to the small regions are contacted with each other on the beam-sensitive substrate. When the pattern to be transferred to the predetermined area on the beam-sensitive substrate is divided into the plurality of small regions, the small regions having the same pattern portion after division are represented by a common small region, and, upon transferring, the pattern of the common small region is transferred onto a plurality of positions on the beam-sensitive substrate.

11 Claims, 18 Drawing Sheets

MASK SIDE

BEAM-
SENSITIVE
SUBSTRATE
SIDE

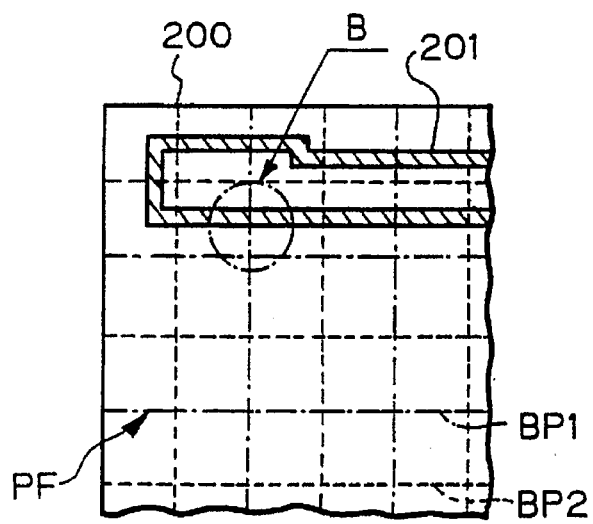
Fig. 5(a)
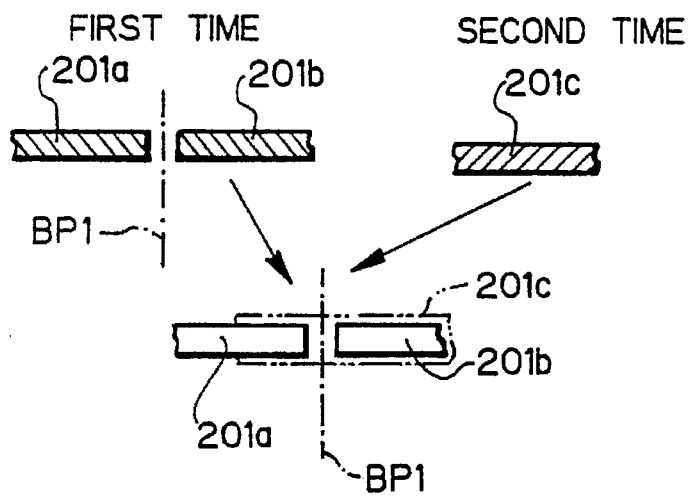
Fig. 5(b)
Fig. 5(c)
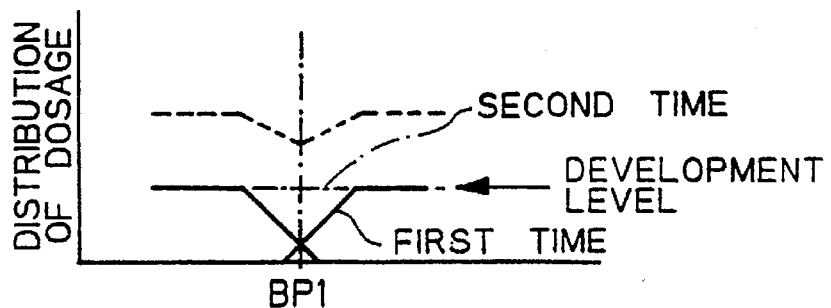
Fig. 5(d)
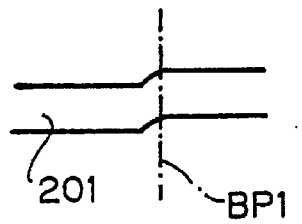
Fig. 5(e)

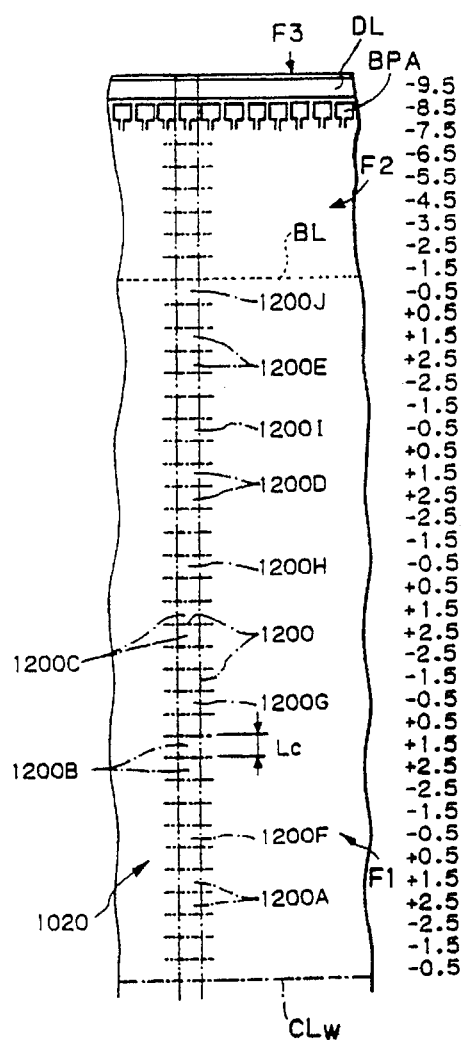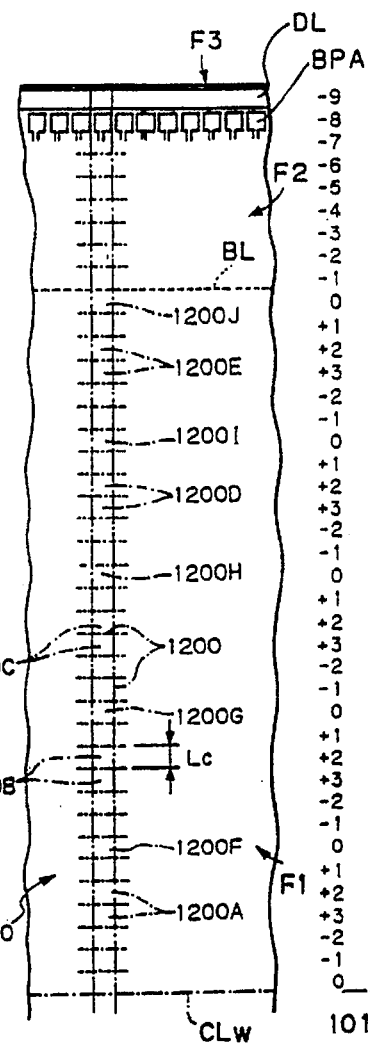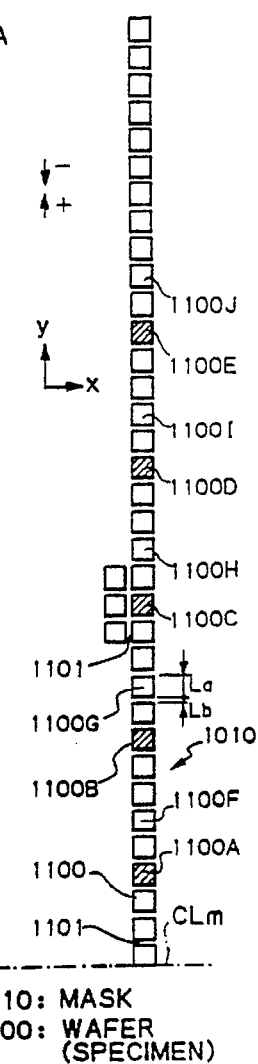

METHOD FOR TRANSFERRING PATTERNS WITH CHARGED PARTICLE BEAM

BACKGROUND OF THE INVENTION

1. Field of the Invention

The present invention relates to a pattern transferring method used in lithography for semiconductor IC circuits, and more particularly, it relates to a method for transferring patterns formed on a mask onto a beam-sensitive substrate by illumination with a charged particle beam such as an electron beam or an ion beam.

2. Description of the Related Art

In recent years, exposure apparatuses using a charged particle beam to achieve both high resolving power of exposure and high throughput have been developed. Among such exposure apparatuses, in the past, exposure apparatuses of the collective transfer type in which patterns for one die (corresponding to one of a plurality of integrated circuits formed on a single wafer) or a plurality of dies are transferred from a mask to a beam-sensitive substrate totally or collectively (in a lump) have been developed. However, in these collective transfer type exposure apparatuses, it was difficult to manufacture the mask acting as a negative and to limit aberration of an optical system below a predetermined value within a large optical field corresponding to one or more dies. In consideration of the above, exposure apparatuses of a separate transfer type have recently been considered in which a pattern to be transferred to a wafer is divided into a plurality of small regions smaller than an area corresponding to one die and then these small regions are successively transferred onto the wafer to complete the entire pattern.

In such exposure apparatuses of separate transfer type, the small regions formed on the mask are separated from each other by opaque border zones. Since such opaque zones should not be formed on the beam-sensitive substrate (wafer), a charged particle beam passing through a given small region is deflected by a deflector so that a pattern image corresponding to current region is formed on the wafer directly adjacent to the previously formed pattern image.

In the above-mentioned arrangement, since an amount of deflection is increased as the small region is spaced apart from a center of the mask, optical fields available to the mask and/or the beam-sensitive substrate are limited.

SUMMARY OF THE INVENTION

An object of the present invention is to provide a charged particle beam type transferring method and a mask used in such a method, wherein limited optical fields can be utilized more effectively.

To achieve the above object, according to one aspect of the present invention, there is provided a method for transferring a predetermined pattern onto a predetermined area on a beam-sensitive substrate, wherein the pattern to be transferred to the predetermined area on the beam-sensitive substrate is divided into a plurality of small regions spaced apart from each other on a mask. Projection of a charged particle beam passing through each small region on the mask is repeated for all of the small regions, and pattern transfer positions are adjusted so that transfer areas corresponding to the small regions are contacted with each other on the beam-sensitive substrate. When the pattern to be transferred to the predetermined area on the beam-sensitive substrate is divided into a plurality of small regions, the small regions having the same pattern portion after division are represented by a common small region, and, upon transferring, the pattern of the common small region is transferred onto a plurality of positions on the beam-sensitive substrate.

According to another aspect of the present invention, there is provided a method for transferring a predetermined pattern onto a predetermined area on a beam-sensitive substrate, wherein the pattern to be transferred to the predetermined area on the beam-sensitive substrate is divided into a plurality of small regions spaced apart from each other on a mask. Projection of a charged particle beam passing through each small region on the mask is repeated for all of the small regions, and pattern transfer positions are adjusted so that transfer areas corresponding to the small regions are contacted with each other on the beam-sensitive substrate. The transferring of the pattern to the beam-sensitive substrate is effected repeatedly twice at a portion of the beam-sensitive substrate, and, between the steps of repeated superimposing transferring, border positions of the respective patterns are different from each other.

According to a further aspect of the present invention, there is provided a method for transfer with a charged particle beam, wherein a mask on which a pattern to be transferred to a specimen is divided into a plurality of small regions by border zones for blocking the charged particle beam, a pattern image on each small region is projected onto the specimen through a projection lens while directing the charged particle beam onto the small regions successively, and the charged particle beam passing through the mask is deflected so that the pattern images projected on the specimen are contiguous to each other in one direction on the specimen. A relation between the plurality of small regions and the corresponding pattern images projected on the specimen is selected so that, when the charged particle beam is directed to the given small region spaced apart from an optical axis of the projection lens, a deflection amount of the charged particle beam passed through the mask becomes minimum along one direction on the specimen.

According to a still further aspect of the present invention, there is provided a mask on which a pattern to be transferred to a predetermined area on a beam-sensitive substrate is divided into a plurality of small regions spaced apart from each other and wherein the pattern to be transferred to the predetermined area on the beam-sensitive substrate comprises first group of small regions divided at first border positions, and a second group of small regions divided at second border positions different from the first border positions.

BRIEF DESCRIPTION OF THE DRAWINGS

FIGS. 5(a)–5(e) are schematic illustrations for explaining advantages in a second embodiment of the present invention;

FIGS. 12(a)–12(c) are schematic illustrations showing a relation between a mask and a wafer according to a fourth embodiment of the present invention;

DETAILED DESCRIPTION

Before embodiments of the present invention are explained, conventional techniques will be described with reference to FIGS. 15 to 20.

Figure 15:
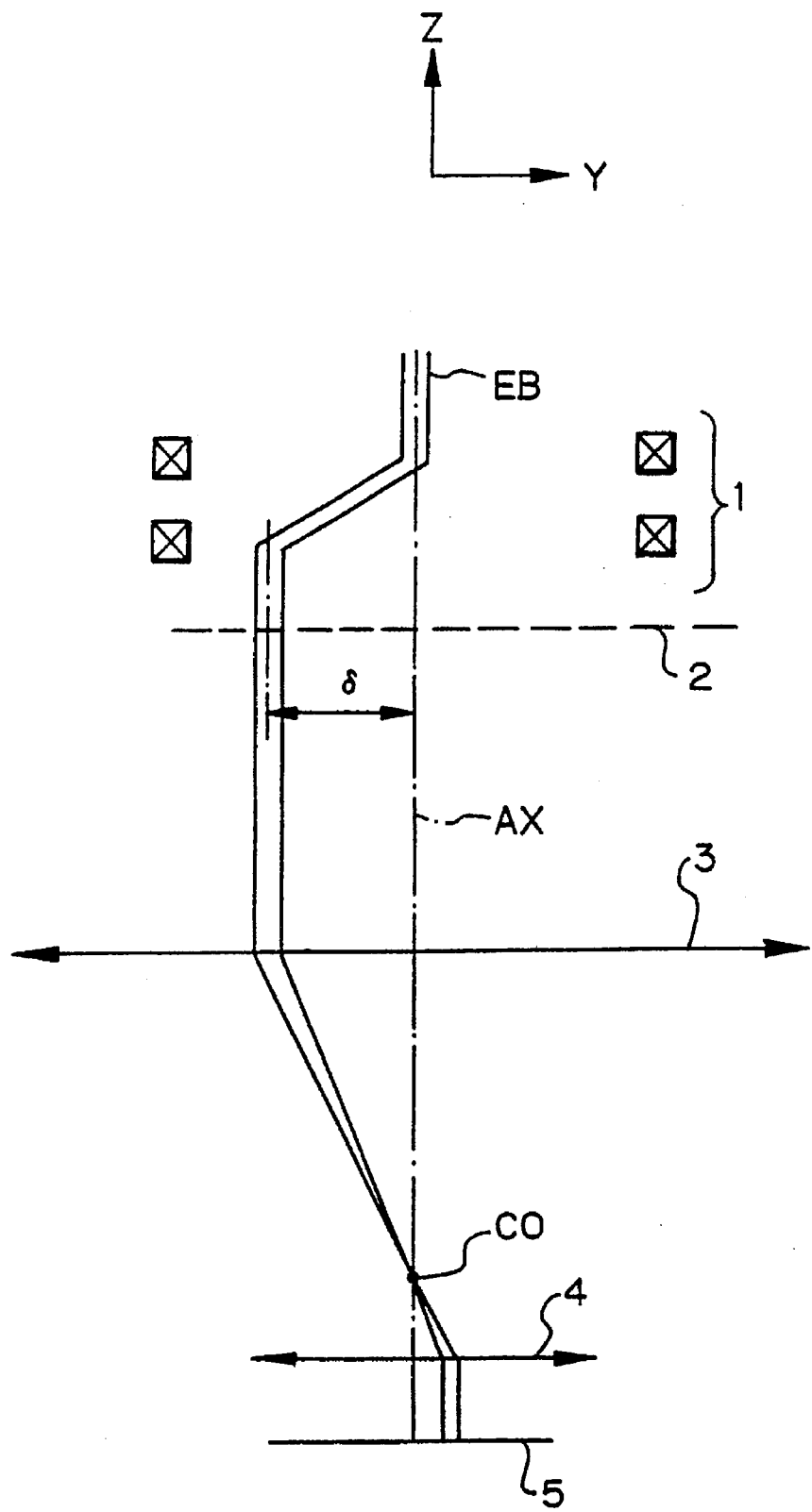
FIG. 15 is a schematic illustration showing an optical system of a conventional electron beam type contraction transferring system.
Figure 16:
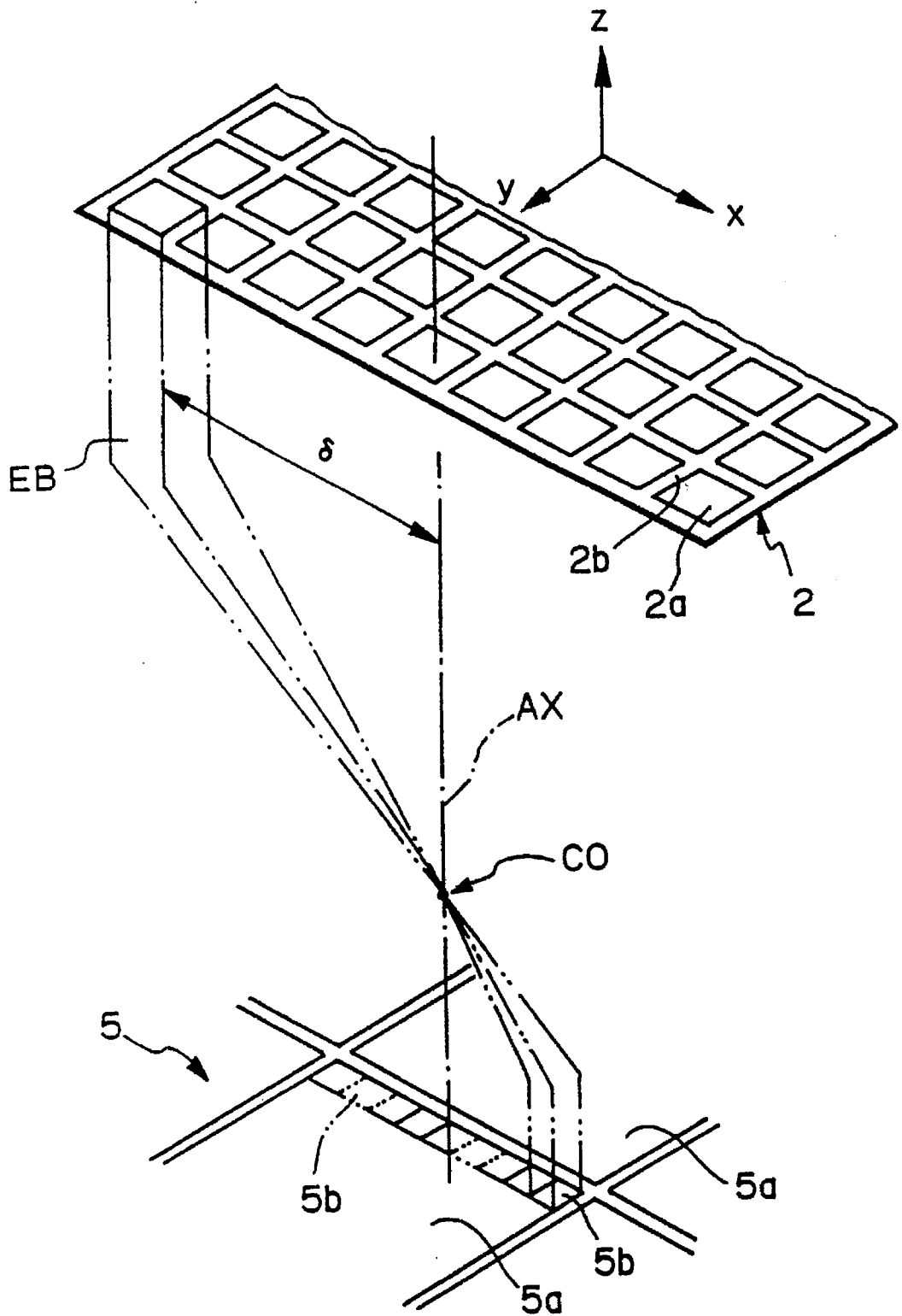
FIG. 16 is a perspective view showing transferring sequences in the electron beam contraction transferring system of FIG. 15.

FIGS. 15 and 16 show an example of a conventional exposure apparatus of separate transfer type as mentioned above. In the apparatus shown in FIGS. 15 and 16, an electron ray or beam EB emitted from a beam source (not shown) and modified to have a square cross section is deflected to be spaced apart from an optical axis AX of an optical system by a predetermined distance 6 by means of deflectors 1 so that the beam is directed to one of a plurality of small regions or segments 2a formed on a mask 2. The small regions 2a include patterns to be transferred to a wafer 5, and the electron beam can pass through each small region. The small regions 2a are divided or separated from each other by border zones 2b for shielding or scattering the electron beam. When the electron beam EB is directed onto the small region 2a, a pattern image corresponding to a shape of the beam permeable portion of the small region 2a is projected onto a predetermined area 5b on the wafer with a predetermined reduction ratio (for example, ¼) through a first projection leans 3 and a second projection leans 4. The pattern images projected on the areas 5b are not illustrated. A point CO is a cross-over point at which the electron beam EB which has passed through the mask 2 intersects with the optical axis AX.

Upon transferring, illumination with the electron beam EB passing through each small region 2a is repeated for all of the small regions, and the pattern images corresponding to the shapes of the beam permeable portions of the small regions 2a are successively transferred onto the different areas 5b on the wafer 5. The positions of the pattern images transferred to the wafer 5 are adjusted by deflectors (not shown) disposed between the mask 2 and the wafer 5 so that the projected areas 5b (corresponding to the small regions 2a) on the wafer are contiguous to each other. More specifically, if the electron beam EB passing through the small region 2a is focused on the wafer 5 through the first and second projection lenses 3, 4, not only the image corresponding to the small region 2a but also the images corresponding to the border zones 2b are transferred to the wafer with the predetermined reduction ratio, so that non-exposed areas corresponding to the border zones 2b will be formed between the projected areas 5b. To avoid the formation of the non-exposed areas, the transfer positions of the pattern images are shifted by amounts corresponding to widths of the border zones 2b. After the pattern images corresponding to all of the small regions 2a formed on the single mask 2 are transferred to the wafer 5, the pattern transferring of one die to an area 5a on the wafer 5 is completed. Incidentally, unless otherwise provided, as shown in FIGS. 15 and 16, a direction of the optical axis AX of the electron beam EB is referred to as a z-direction, a direction parallel with one side of the small region 2a on the mask is referred to as an x-direction, and a direction perpendicular to the z-direction and the x-direction is referred to as a y-direction.

Figure 17A:
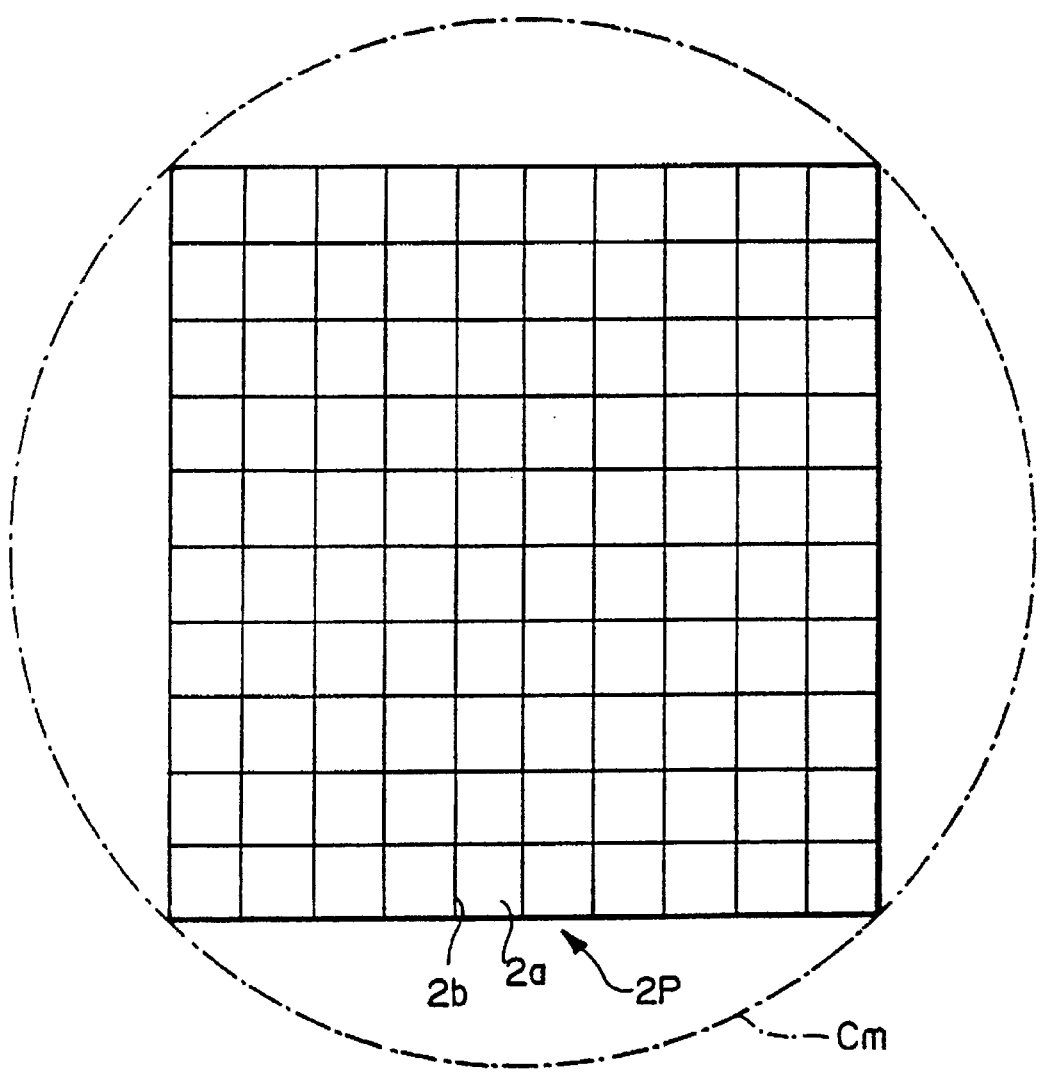
FIGS. 17(a) and 17(b) are schematic illustrations showing a relation between small regions on a mask and transferred areas on a beam-sensitive substrate in the prior art.
Figure 17B:
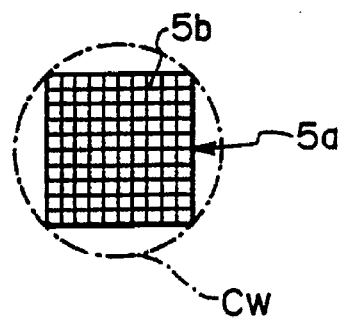

In the exposure apparatus of separate transfer type as mentioned above, the small regions 2a on the mask 2 correspond to the projection or transfer areas 5b on the wafer 5 at a ratio of 1:1. For example, as shown in FIGS. 17(a) and 17(b), when the area 5a for one die on the wafer 5 is divided into one hundred transfer areas 5b, one hundred small areas 2a the number of which is equal to that of the areas 5b are formed on the mask 2. Since the pattern is transferred from the mask 2 to the wafer 5 with the reduction ratio, each small region 2a is greater than the corresponding transfer area 5b by the factor corresponding to the reciprocal number of the reduction ratio. In addition, not only the small regions 2a but also the border zones 2b are formed on the mask 2. Accordingly, as shown in FIGS. 17(a) and 17(b), the dimension of a range 2P on the mask 2 in which the small regions 2a are provided (referred to as "pattern holding range" hereinafter) is always greater than that of the area 5a on the wafer 5 corresponding to all of the small regions 2a. In the illustrated embodiment, while an example that the pattern holding range 2P and the area 5a include regions and areas corresponding to one die is explained, these portions 2P, 5a do not always include the areas corresponding to one die.

In the electron beam transferring apparatus, due to aberration of the optical system, optical error, in the resolving power, for example, is increased as illumination position of the electron beam is spaced apart from the optical axis of the optical system (in other words, as the deflection amount 6 shown in FIG. 15 is increased). A range within which the optical error at the mask side is maintained below an acceptable value and a range within which the optical error at the beam-sensitive substrate (wafer) side is maintained below an acceptable value are both defined as circular areas the center of each being positioned on the optical axis of the optical system for the electron beam. Hereinbelow, the range within which the optical error at the mask side is maintained below the acceptable value is referred to as "mask side optical field" and the range within which the optical error at the beam-sensitive substrate side is maintained below the acceptable value is referred to as "beam-sensitive substrate side optical field". In FIGS. 17(a) and 17(b), in order to transfer the patterns of all of the small regions 2a onto the wafer 5 with predetermined accuracy in a condition that the mask 2 and the wafer 5 are both stationary, a circle Cm circumscribing the pattern holding range 2P must be included within the mask side optical field and a circle Cw circumscribing the area 5a on the wafer 5 must be included within the beam-sensitive substrate side optical field.

Since the circle Cm is considerably greater than the circle Cw, the dimensions of the pattern holding range 2P on the mask 2 and of the corresponding area 5a on the wafer 5 are limited in dependence upon the dimension of the mask side optical field of the transferring apparatus. In other words, at the beam-sensitive substrate side, although the optical field has a larger scope, the patterns can only be transferred to a place within a limited range smaller than the acceptable optical field. Accordingly, even when all of the areas 5a on the wafer 5 are included in the beam-sensitive substrate side optical field of the transferring apparatus, since the area 5a must be included in the smaller range corresponding to the circle Cm, it is necessary to shift the areas 5a within the limited range of the beam-sensitive substrate side optical field successively, with the result that the stage driving time for shifting the wafer 5 is increased to increase the total treating time, thereby reducing the throughput. Particularly, when the overhead times for shuttling the stage (i.e., changing the driving direction of the stage) is cumulatively totalled, waste time is increased, thereby reducing the throughput greatly.

Figure 18A:
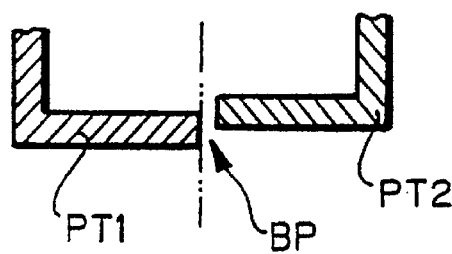
FIGS. 18(a)–18(c) are views for explaining a problem caused at a connection portion between patterns in the prior art.
Figure 18B:
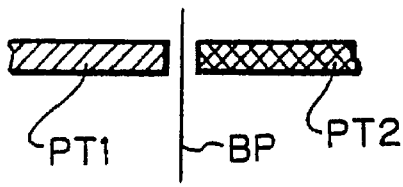
Figure 18C:
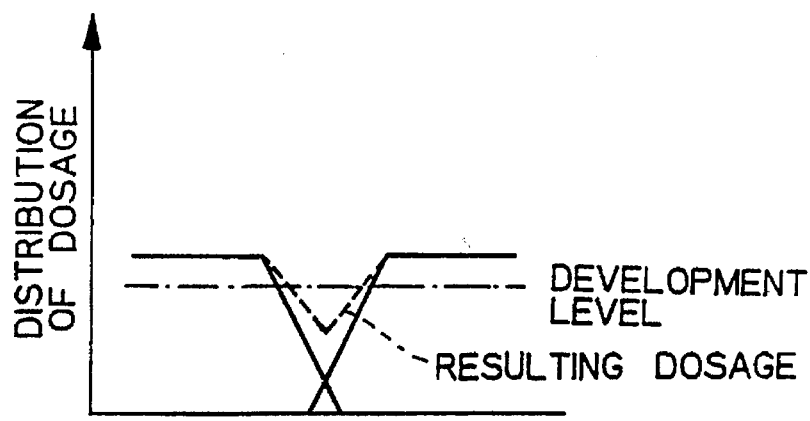
Figure 19A:
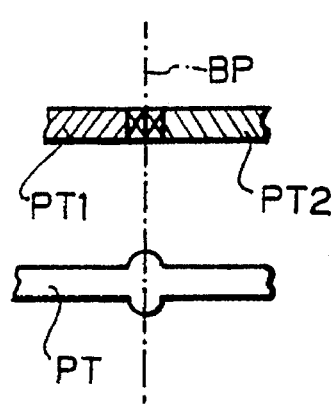
FIGS. 19(a) and 19(b) are views for explaining a problem caused at a connection portion between patterns in the prior art.
Figure 19B:
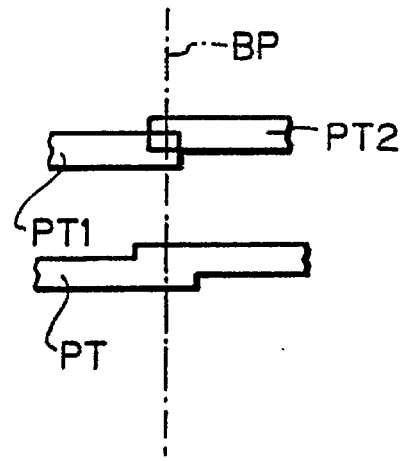

In the exposure apparatus of separate transfer type as mentioned above, since the pattern for one die is formed by connecting the plurality of pattern images to each other, as shown in FIG. 18(a), the pattern images PT1, PT2 may be deviated from each other at a border position BP between the divided pattern images PT1, PT2, which results in erroneous operation of the produced device. For example, when the pattern images PT1, PT2 are separated from each other at the border position BP as shown in FIG. 18(b) and the dose amounts of the left and right pattern images PT1, PT2 are as indicated by the solid lines in FIG. 18(c), the dose amount at the border position BP corresponds to the sum of the dose amounts of the left and right pattern images PT1, PT2 as shown by the broken line in FIG. 18(c). In this case, if a development level after transferring is set to have a value greater than a minimum dose amount at the border position BP as shown by the dot and chain line, a pattern image PT after development will be discontinued to cause the poor electrical connection. On the other hand, as shown in FIGS. 19(a) and 19(b), if the left and right pattern images PT1, PT2 are overlapped, the dose amount at the border position BP will be increased in comparison with the other portions, with the result that the pattern PT after development is enlarged in the widthwise direction at the border position BP, thereby causing a danger of contacting with a neighboring pattern.

U.S. Pat. No. 5,347,592 discloses a transferring method wherein an aperture corresponding to a repeated pattern such as a memory cell is formed in a mask and an image of the aperture is repeatedly transferred onto a plurality positions on a wafer. This method clearly differs from the present invention wherein the pattern to be formed on the beam-sensitive substrate is divided into the plurality of small regions on the mask and all of the pattern images are generated by the single mask, since, in the disclosed method, the images of the patterns other than the repeated pattern are generated by a variable shape forming stop without generating any pattern other than the repeated pattern by a single mask.

Next, a principle for achieving a desirable function in the present invention will be explained.

Figure 1A:
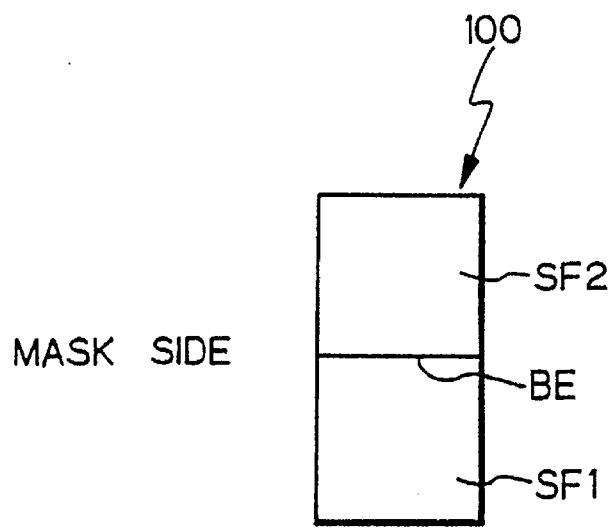
FIGS 1(a) and 1(b) are schematic illustrations for explaining one advantage in a first embodiment of the present invention.
Figure 1B:
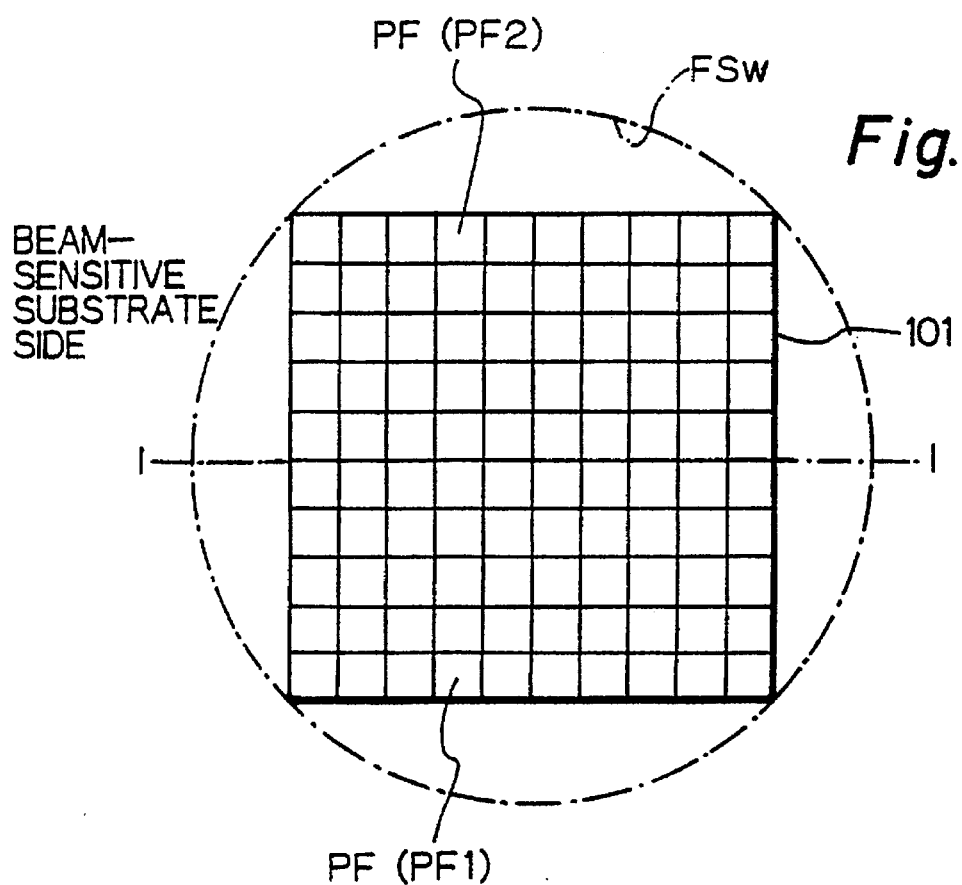

With reference to FIGS. 1(a) and 1(b), a pattern to be transferred onto a predetermined area 101 on a beam-sensitive substrate is divided into a plurality of small regions SF1, SF2 on a mask which are spaced apart from each other. Illumination with a charged particle beam covering one of the small regions SF1, SF2 each time is repeated. Pattern transfer positions at which the small regions are transferred to the beam-sensitive substrate are adjusted so that transfer areas corresponding to the small regions SF1, SF2 are contacted with each other on the beam-sensitive substrate, thereby transferring the predetermined pattern to the predetermined area 101 on the beam-sensitive substrate. When the pattern to be transferred to the predetermined area 101 on the beam-sensitive substrate is divided into the plurality of small regions SF1, SF2 on the mask, the small regions PF1 (PF2) having the same pattern shape after division are treated as a common small region SF1 (SF2), and, upon transferring, the pattern of the common small region SF1 (SF2) is transferred onto a plurality of positions on the beam-sensitive substrate.

With the arrangement as mentioned above, it is possible to set a mask side optical field of an optical system used in the transferring to become smaller than a mask side optical field which would be required when the common small regions SF1, SF2 are not used.

Figure 2A:
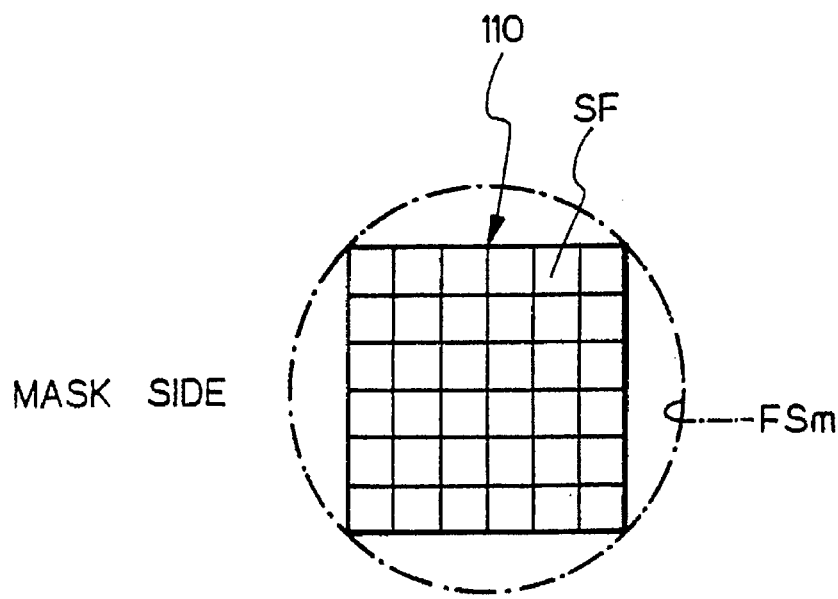
FIGS. 2(a) and 2(b) are schematic illustrations for explaining another advantage in the first embodiment of the present invention.
Figure 2B:
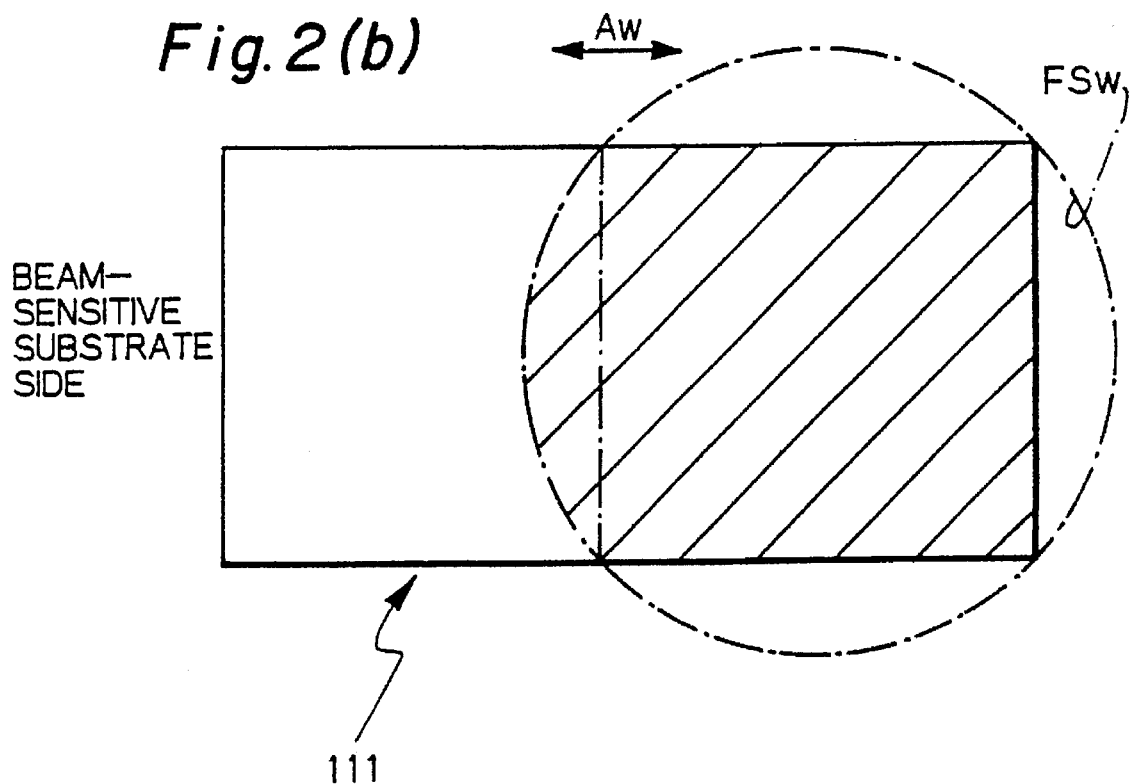

In an arrangement as shown in FIG. 2(a) and 2(b), a predetermined area 111 on the beam-sensitive substrate is set to become greater than a beam-sensitive substrate side optical field FSw of a charged particle transferring apparatus in one direction (shown by the arrow Aw) of the beam-sensitive substrate, so that, upon transferring, pattern images of all of small regions SF on the mask can be transferred within the predetermined areas 111 by shifting the beam-sensitive substrate in said one direction.

Figure 3A:
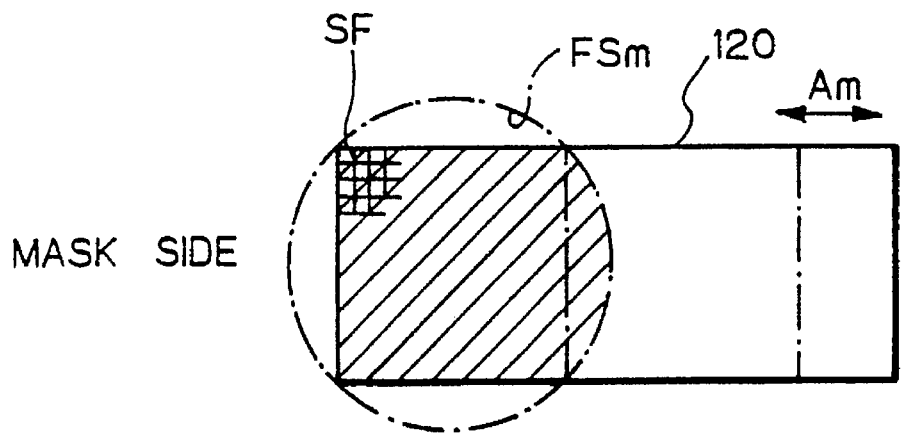
FIGS. 3(a) and 3(b) for explaining a further advantage in the first embodiment of the present invention.
Figure 3B:
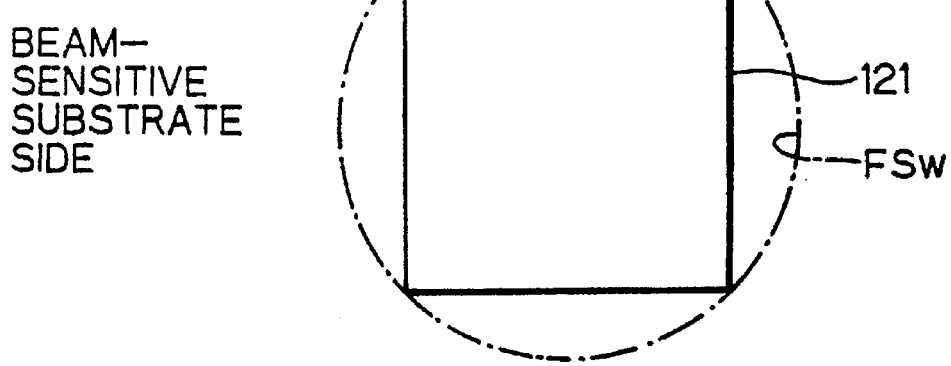

In an arrangement as shown in FIGS. 3(a) and 3(b), the dimension of a predetermined area 121 on the beam-sensitive substrate is selected to be included in the beam-sensitive substrate side optical field FSw of the charged particle transferring apparatus, and the pattern to be transferred onto the predetermined area 121 on the beam-sensitive substrate is divided into a plurality of small regions SF disposed in an area 120 greater than a mask side optical field FSm of the charged particle transferring apparatus in one direction (shown by the arrow Am) of the mask, so that, upon transferring, pattern images of all of small regions SF on the mask can be transferred within the predetermined areas 121 by shifting the mask in said one direction.

Figures 4A, 4B:
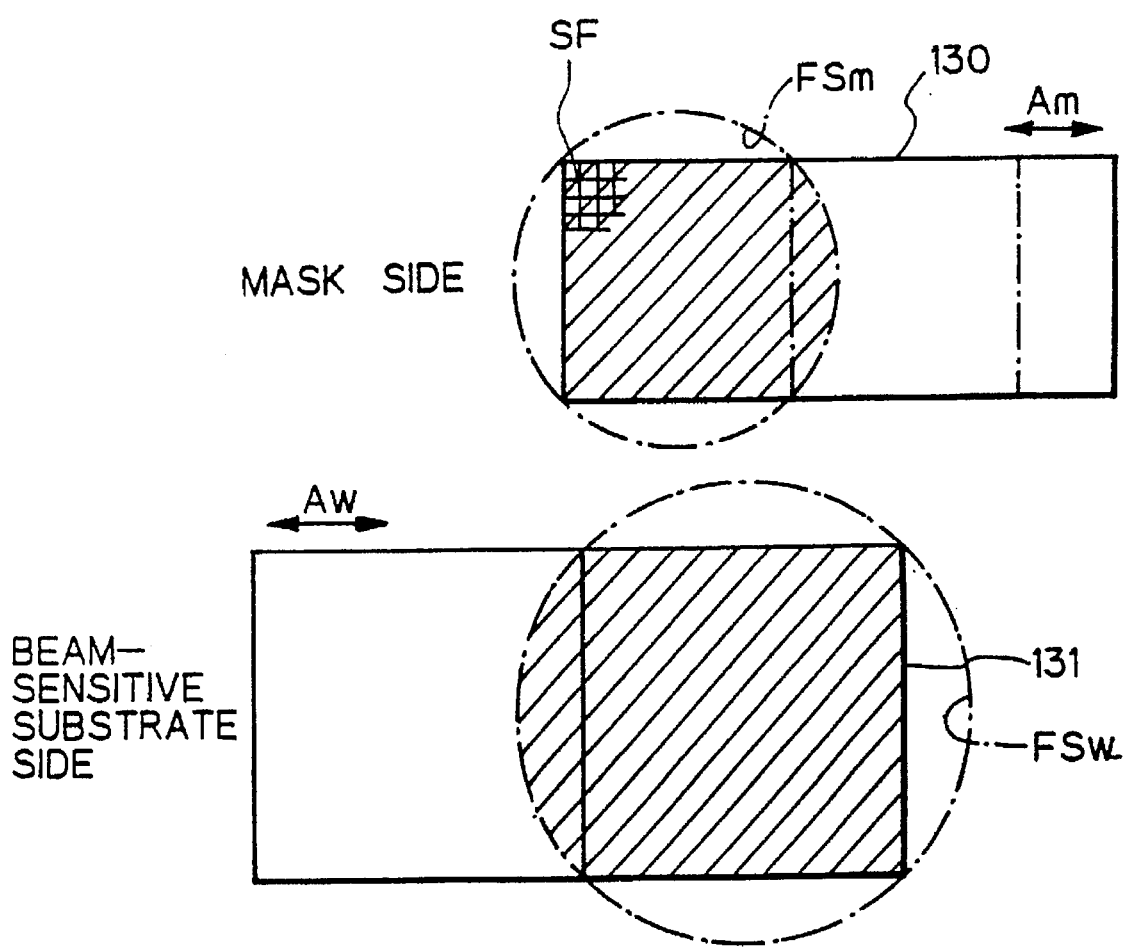
FIGS. 4(a) and 4(b) are schematic illustrations for explaining a still further advantage in the first embodiment of the present invention.

In an arrangement as shown in FIG. 4(a) and 4(b), the dimension of a predetermined area 131 on the beam-sensitive substrate is selected to become greater than the beam-sensitive substrate side optical field FSw of the charged particle transferring apparatus in one direction (shown by the arrow Aw) of the beam-sensitive substrate and the pattern to be transferred onto the predetermined area 131 on the beam-sensitive substrate is divided into a plurality of small regions SF disposed in an area 130 greater than the mask side optical field FSm of the charged particle transferring apparatus in one direction (shown by the arrow Am)

of the mask, so that, upon transferring, pattern images of all of small regions SF on the mask can be transferred within the predetermined area 131 by shifting the mask in said one direction of the mask and shifting the beam-sensitive substrate in said one direction of the beam-sensitive substrate.

FIGS. 5(a) and 5(b) shows a charged particle transferring method in which a pattern 201 to be transferred onto a predetermined area 200 on a beam-sensitive substrate is divided into a plurality of spaced apart small regions, illumination (to project onto the mask) with a charged particle beam covering one of the small regions each time is repeated, and pattern transfer positions at which the small regions are transferred to the beam-sensitive substrate are adjusted so that transfer regions PF corresponding to the small regions are contacted with each other on the beam-sensitive substrate, thereby transferring the predetermined pattern 201 to the predetermined area 200 on the beam-sensitive substrate. The transferring of the pattern 201 onto the beam-sensitive substrate is repeated at a portion of the beam-sensitive substrate by at least two times, and, between the preceding transferring and the succeeding transferring, border positions BP1 and BP2 are different from each other.

In this transferring method, when the pattern to be transferred to the predetermined area on the beam-sensitive substrate is divided into the plurality of small regions on the mask, the small regions having the same pattern shape after division are treated as a common small region, and, upon transferring, the pattern of the common small region can be transferred onto a plurality of positions on the beam-sensitive substrate.

Figure 10A:
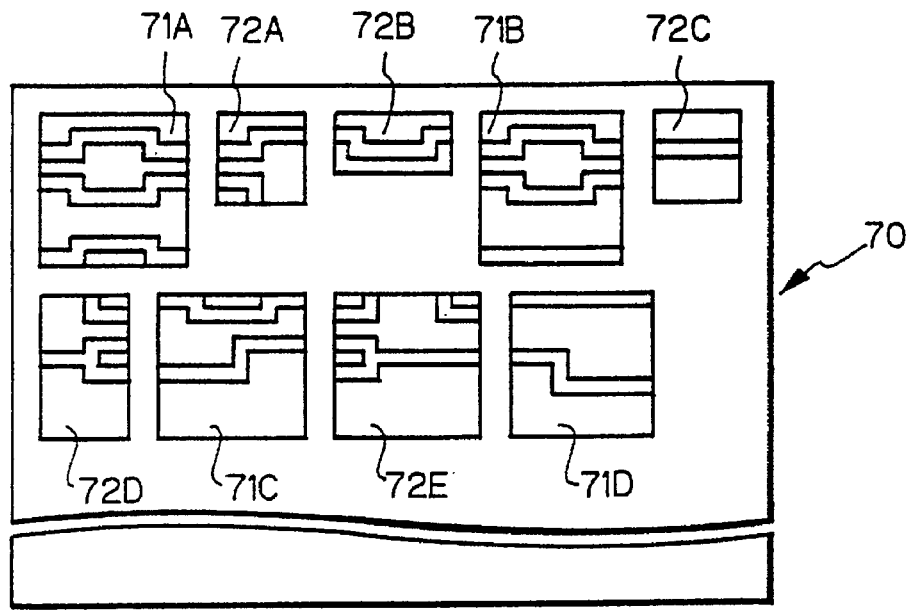
FIGS. 10(a)–10(c) are sectional views showing arrangement of small regions on a mask used with the second embodiment, and patterns formed on the small regions.
Figure 10B:
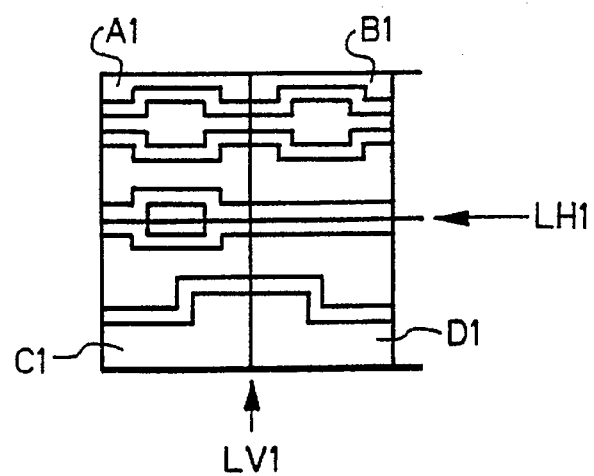
Figure 10C:
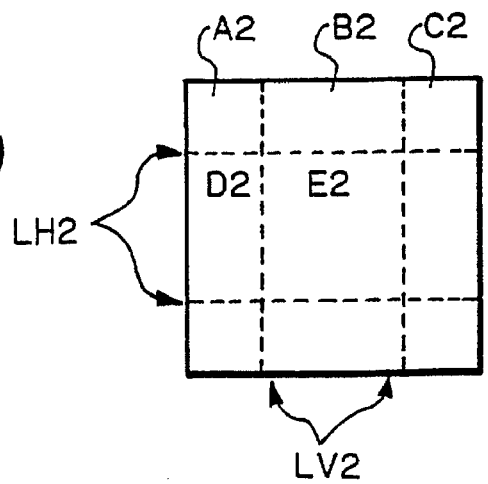

FIGS. 10(a)–10(c) show a mask on which a pattern to be transferred to a predetermined area on a beam-sensitive substrate is divided into a plurality of small regions spaced apart from each other and wherein the pattern to be transferred to the predetermined area on the beam-sensitive substrate comprises first group of small regions (71A, 71B, 71C, 71D) divided at first border positions LV1, LH1, and a second group of small regions (72A, 72B, 72C, 72D, 72E) divided at second border positions LV2, LH2 different from the first border positions LV1, LH1.

As shown in FIG. 1(a) and 1(b), when the predetermined area 101 on the beam-sensitive substrate is divided into one hundred transferred areas PF, it is assumed that the pattern images of the transfer areas PF1 positioned below the line I—I in FIG. 1(b) are the same as each other and the pattern images of the transfer areas PF2 positioned above the line I—I are the same as each other. In this case, the pattern to be transferred onto the transfer areas PF1 positioned below the line I—I is formed in the small region SF1 and the pattern to be transferred onto the transfer areas PF2 positioned above the line I—I is formed in the small region SF2. As a result, the dimension of a range 100 including the small regions SF1, SF2 can be reduced in comparison with the conventional cases. Accordingly, the range 100 including the small regions SF1, SF2 on the mask can be smaller than the predetermined area 101 on the beam-sensitive substrate, and, therefore, the predetermined area 101 can be widened to the maximum extent corresponding to the beam-sensitive substrate side optical field.

In the arrangement shown in FIG. 2(b), as the beam-sensitive substrate is shifted in one direction (shown by the arrow Aw), an overlapped area (hatched area in FIG. 2(b)) between the predetermined area 111 of the beam-sensitive substrate and the beam-sensitive substrate side optical field FSw is gradually changed. Thus, the pattern can be transferred onto the area 111 greater than the beam-sensitive substrate side optical field FSw by directing the charged particle beam on the small regions SF successively while maintaining the mask in the stationary condition so that the area 110 including all of the small regions SF is included in the mask side optical field FSm.

In the arrangement shown in FIG. 3(a), as the mask is shifted in one direction (shown by the arrow Am), an overlapped area (hatched area in FIG. 3(a)) between the area 120 of the mask including the small regions SF and the mask side optical field FSm is gradually changed. Thus, even when some of the small regions SF to be transferred to the predetermined area 121 of the beam-sensitive substrate are disposed in the area 120 out of the mask side optical field FSm, the pattern images of all of the small regions SF can be transferred onto the predetermined area 121 of the beam-sensitive substrate.

In the arrangement shown in FIG. 4(b), as the beam-sensitive substrate is shifted in one direction (shown by the arrow Aw), an overlapped area (hatched area in FIG. 4(b)) between the predetermined area 131 of the beam-sensitive substrate and the beam-sensitive substrate side optical field FSw is gradually changed, and, as the mask is shifted in one direction (shown by the arrow Am), an overlapped area (hatched area in FIG. 4(a)) between the area 130 of the mask including the small regions SF and the mask side optical field FSm is gradually changed. Thus, even when some of the small regions SF to be transferred to the predetermined area 131 greater than the beam-sensitive substrate side optical field FSw are disposed in the area 130 out of the mask side optical field FSm, the pattern images of all of the small regions SF can be transferred onto the predetermined area 131 of the beam-sensitive substrate.

FIG. 5(a) shows an example that the transferring of the pattern 201 (hatched area in FIG. 5(a)) to the predetermined area 200 of the beam-sensitive substrate is repeated twice. In the first transferring, the pattern 201 is divided into pattern portions at the border position BP1 shown by the dot and chain line and the pattern portions are transferred. In the second transferring, the pattern 201 is divided into pattern portions at the border position BP2 shown by the broken line and the pattern portions are transferred. The dose amount of the electron beam in each transferring may be set to about a half of the dose amount required when the repeated transferring is not effected. In the transferring condition of the pattern 201 with reference to a portion B (FIG. 5(a)) where the pattern is divided at the first border position BP1, as shown in FIG. 5(b), during the first transferring, a pattern portion 201a is transferred on the left side of the border position BP1 and a pattern portion 201b is transferred on the right side of the border position BP1. On the other hand, in the second transferring, since there is no border position BP2 in the portion B, a pattern portion 201c is transferred en bloc. By effecting the first and second transferring operations, as shown in FIG. 5(c), at the border position BP1, the pattern portion 201c is overlapped with the pattern portions 201a, 201b.

The distribution of the dose amount of the overlapped portion is such as shown in FIG. 5(d). That is to say, during the first transferring, in the vicinity of the border position BP1, the dose amount is decreased as it approaches the border position BP1, as shown by the solid line, because the pattern image becomes dim more or less at the periphery of a transfer area. On the other hand, during the second transferring, as shown by the dot and chain line in FIG. 5(d), the dose amount is kept constant regardless of the border position BP1. Accordingly, the total or resulting dose amount obtained by the repeated transferring becomes such as shown by the broken line in FIG. 5(d), so that the reduction in dose amount at the border position BP1 becomes about half in comparison with the reduction of the dose amount which would occur when the repeated transferring (FIG. 5(c)) is not effected. Thus, even when the development level is set as is in the conventional manner, the pattern 201 is not interrupted at the border position BP1. In FIGS. 5(b) and 5(c), while an example that the pattern portions 201a, 201b are separated from one another in the first transferring is explained, if the pattern portions are partially overlapped, since the total dose amount of the overlapped portion is smaller than that in the conventional case, the swelling of the pattern as shown in FIG. 19 can be prevented. If the ends of the pattern portions 201a, 201b are overlapped and are offset from each other along the direction of the border position BP1, as shown in FIG. 5(e), the pattern is smoothly changed at the border position BP1. In the above description, while an example that the repeated transferring is effected by two times is explained, the pattern may be divided into three or more pattern portion groups and the transferring may be repeated by three or more times. As the number of repeats or overlaps is increased, the dose amount is distributed more and more evenly, thereby decreasing the error of the pattern at the border position. The repeated transferring may be performed through the whole area or partial area of the beam-sensitive substrate.

When the pattern 201 is transferred onto the beam-sensitive substrate by repeating the transferring operations by n times and if the repeated transferring is effected with the ratio of 1:1 between a plurality of transfer areas PF and small regions on the mask as is the case in the conventional technique, the number of the small regions on the mask will be greater than that required when the repeated transferring is not effected, by n times, with the result that the dimension of the area including the small regions of the mask is increased by n times or more. According to the present invention, since the pattern portions having the same shape after division can be treated as the common small region(s), the area including the small regions of the mask can be reduced to be easily contained within the mask side optical field of the charged particle beam transferring apparatus.

In the arrangement shown in FIG. 10(a)–(c), by successively illuminating, with the charged particle beam, the small regions 71A, 71B, 71C, 71D belonging to the first group on the mask 70, the pattern images are transferred to the beam-sensitive substrate so that the pattern images are contiguous to each other along the first border positions LV1, LH1. Then, by successively illuminating with the charged particle beam the small regions 72A, 72B, 72C, 72D, 72E belonging to the second group, the pattern images are transferred to the beam-sensitive substrate so that the pattern images are contiguous to each other along the second border positions LV2, LH2 in the superimposing fashion. Since the first border positions LV1, LH1 are different from the second border positions LV2, LH2, the dose amounts at the connecting portions are made even.

Next, a first embodiment of the present invention will be explained with reference to FIGS. 6 to 9.

Figure 6:
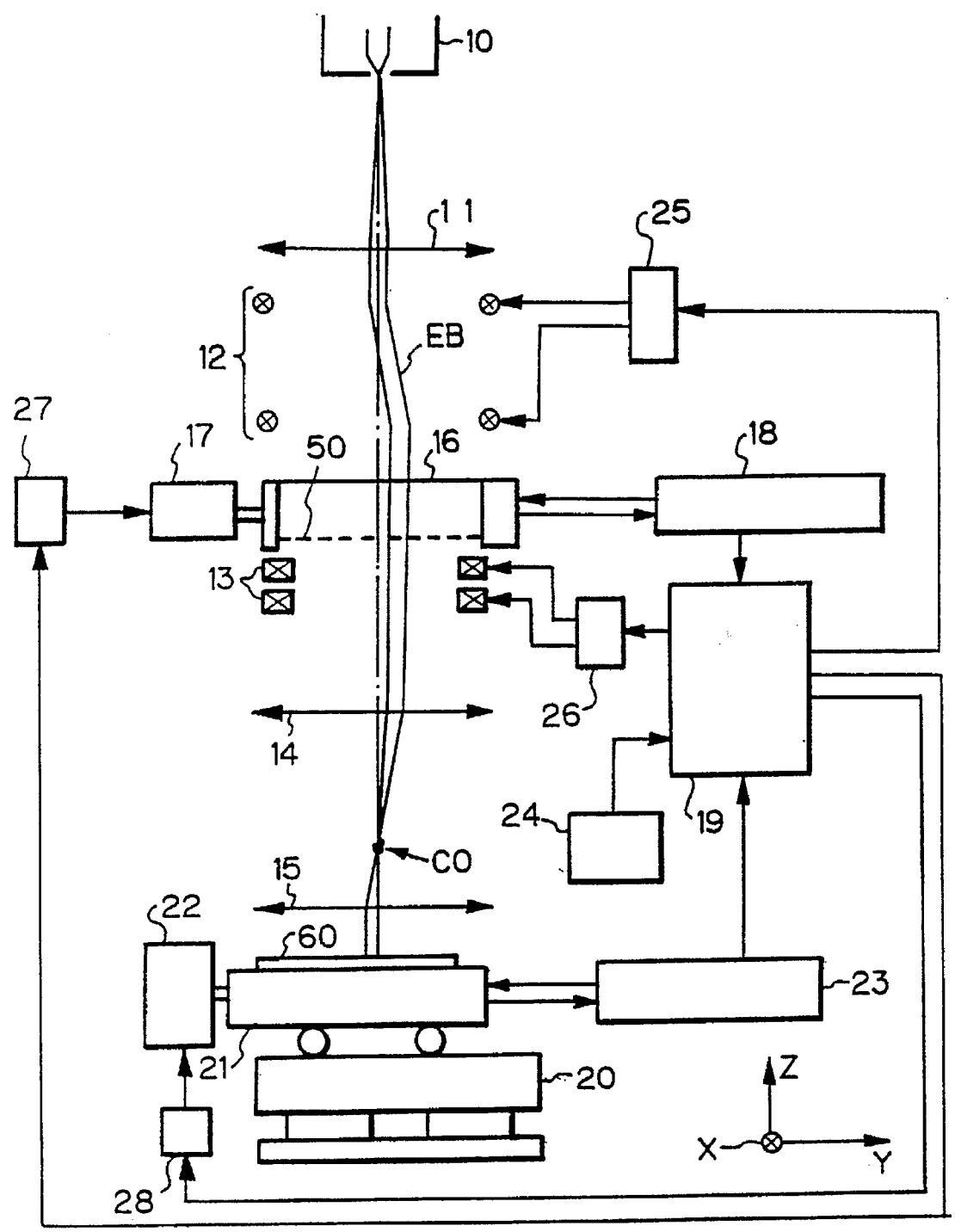
FIG. 6 is a schematic illustration showing an electron beam type contraction transferring system which can be used for the embodiments of the present invention.

FIG. 6 is a schematic illustration of an electron beam contraction transferring apparatus used in the first embodiment. An electron beam or ray EB emitted from an electronic gun 10 is changed to parallel beam by means of a condenser lens 11, which parallel beam is deflected in an x-y plane (parallel with the X-axis and Y-axis) by means of field selection deflectors 12 to be directed to one of small regions (not shown) on a mask 50 which will be described later. The electron beam EB passed through the mask 50 is deflected by a predetermined amount by means of deflectors 13, and then is focused on a predetermined position on a beam-sensitive substrate 60 with a predetermined reduction ratio (for example, ¼) through lenses 14, 15. The mask 50 is attached to a mask stage 16 so that the mask is maintained in parallel with the x-y plane. The mask stage 16 is continuously shifted in the X-direction and is driven in the y-direction step-by-step by means of a drive means 17. A position of the mask stage 16 in the x-y plane is detected by a laser interferometer 18, and the detected result is sent to a controller 19. Incidentally, the x-direction corresponds to a direction perpendicular to the plane of FIG. 6.

The beam-sensitive substrate 60 is attached to a movable stage 21 supported on a beam-sensitive substrate support 20 so that the beam-sensitive substrate is maintained in parallel with the x-y plane. The movable stage 21 can be continuously shifted by means of a drive means 22 in a direction opposite to the direction that the mask stage 16 is continuously shifted. The reason why the movable stage is shifted in the opposite direction is that the pattern images are turned over by the lenses 14, 15. A position of the movable stage 21 in the x-y plane is detected by a laser interferometer 23, and the detected result is sent to the controller 19.

The controller 19 serves to calculate the deflection amount of the electron beam EB caused by the deflectors 12, 13 on the basis of exposure data inputted from an input device 24 and position information regarding the mask stage 16 and the movable stage 21 detected by the laser interferometers 18, 23, and also calculate information (for example, positions and shifting speeds) required for controlling the operations of the mask stage 16 and the movable stage 21. The calculated deflection amount is outputted to deflection amount setting devices 25, 26 so that the deflection amounts of the deflectors 12, 13 are adjusted by the deflection amount setting devices 25, 26, respectively. The calculated information regarding the stages 16, 21 is outputted to the drivers 27, 28. The drivers 27, 28 serve to control the operations of the drive means 17, 22 so that the stages 16, 21 are driven on the basis of the calculated results. The input device 24 may be of the type which can read magnetic information formed by an exposure date generating means or can read exposure date registered in the mask 50 and the beam-sensitive substrate 60 when they are used.

Figure 7A:
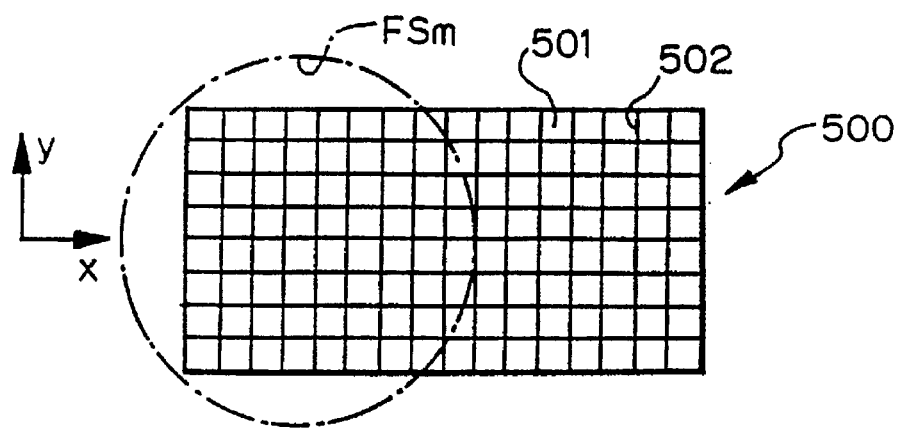
FIGS 7(a) and 7(b) showing a relation between a mask and a beam-sensitive substrate in the first embodiment.
Figure 8:
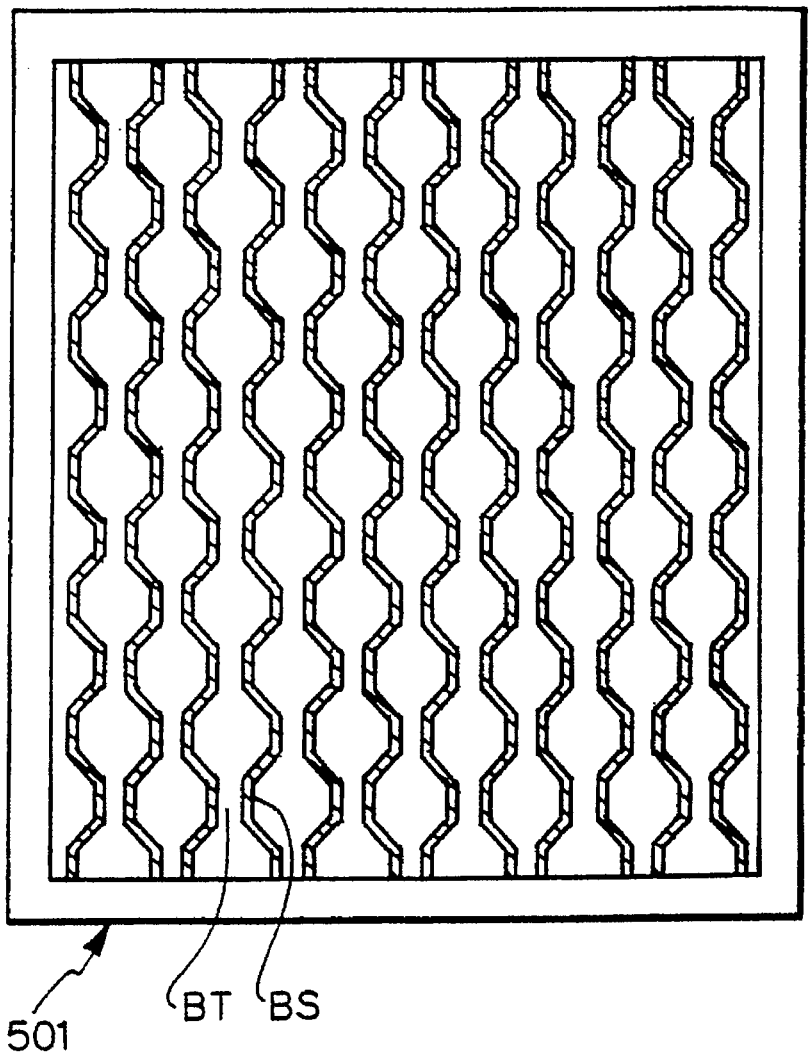
FIG. 8 is a plan view showing an example of a pattern formed on a small region of the mask of FIG. 7.
Figure 9A:
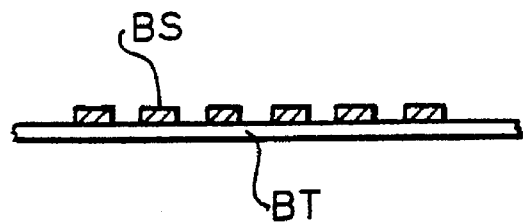
FIGS. 9(a) and 9(b) are sectional views of two kinds of masks used with the present invention.
Figure 9B:

FIG. 7(a) shows an area 500 including small regions 501 on the mask 50. In the illustrated embodiment, the small regions 501 are disposed on the area 500 greater than a mask side optical field FSm of an electron beam directing optical system in the x-direction. The small regions 501 are separated from each other by border zones 502 for blocking or dispersing the electron beam. Each small region 501 includes electron beam permeable portions (white areas) BT corresponding to the pattern shape to be transferred onto the beam-sensitive substrate, for example, as shown in FIG. 8. The mask used for transferring using the electron beam may be, for example, a so-called scattering mask wherein the electron beam permeable portions BT are formed by a film made of silicone nitride (SIN) and tungsten scattering portions BS are provided on the film as shown in FIG. 9(a), or, a so-called stencil (aperture) mask wherein through holes formed in tungsten scattering portions BS are used as the electron beam permeable portions BT as shown in FIG. 9(b).

Figure 7B:
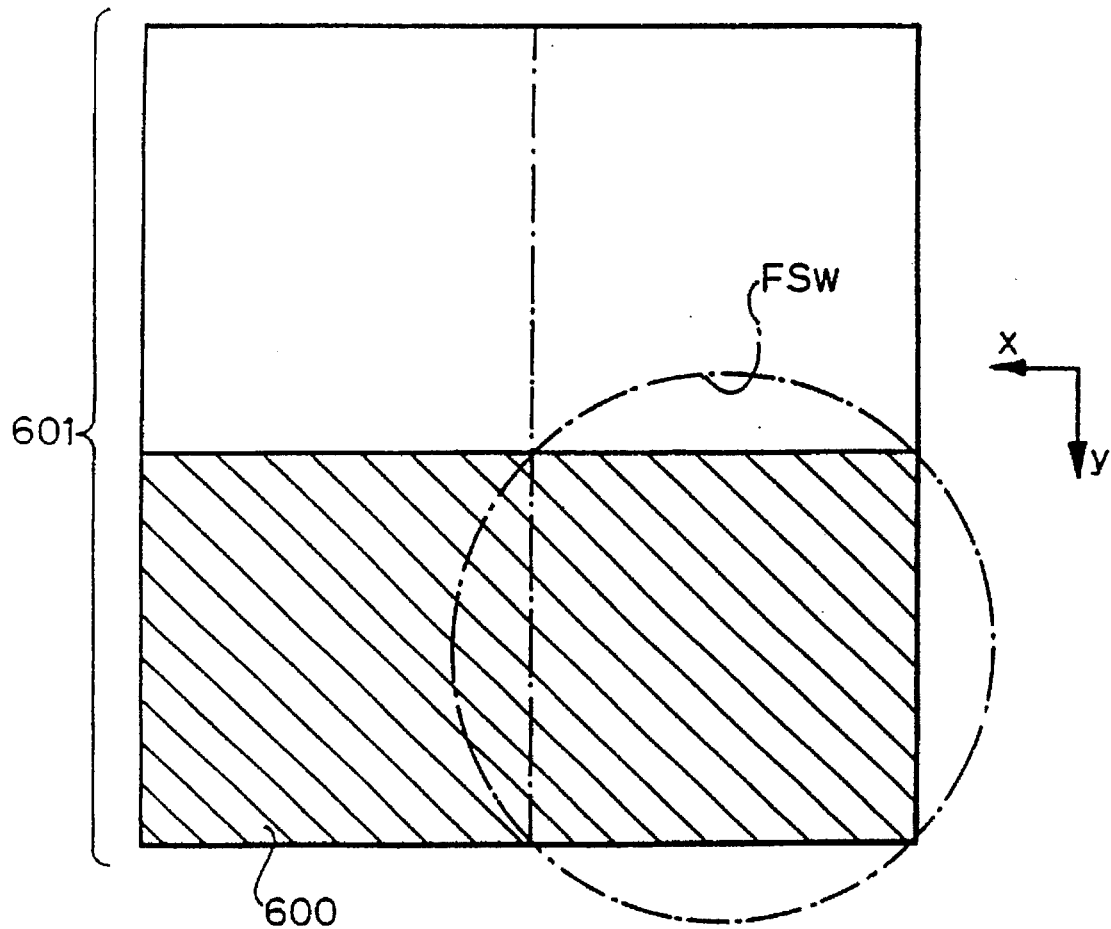

A hatched portion 600 on the beam-sensitive substrate 60 shown in FIG. 7(b) shows an area on which the combination of the small regions 501 on the mask 50 can be transferred. The area 600 corresponds to a half of an area 601 for one die to be formed on the beam-sensitive substrate 60 and is greater than a beam-sensitive substrate side optical field FSw in the x-direction. The beam-sensitive substrate side optical field FSw has a dimension which includes about ¼ of the area 601 of one die. When the pattern to be transferred onto the area 600 of the beam-sensitive substrate 60 is divided into the small regions 501, the small regions having the same shape after division are treated as a common small region 501. As a result, the number of the small regions 501 becomes smaller than the number of the divisions of the area 600.

With the arrangement as mentioned above, a correspondence relation between the small regions 501 and the transfer positions on the beam-sensitive substrate 60 is previously inputted from the input device 24 to the controller 19 as the exposure data. In the transferring, the deflection amounts of the deflectors 12, 13 and the positions of the stages 16, 21 are controlled on the basis of the exposure data so that the pattern images of the small regions 501 are transferred onto the designated positions on the beam-sensitive substrate 60. During the transferring, the mask stage 16 and the movable stage 21 are continuously shifted in opposite directions along the x-axis. As a result, the overlapped portion between the area 500 and the optical field FSm and the overlapped portion between the area 600 and the optical field FSw shown in FIG. 7(b) are gradually changed, with the result that the pattern images of all of the small regions 501 included in the area 500 can be transferred onto the area 600 on the beam-sensitive substrate 60. During the continuous shifting movement of the stages, the adjustment of the illumination position for the electron beams EB and the pattern transferring position in the x-direction are effected by the deflectors 12, 13. After the transferring of the pattern images to the area 600 is finished, the movable stage 21 is shifted in the y-direction by a distance corresponding to the width of the area 600, and the pattern images are transferred onto the remaining area. In this way, the transferring of the pattern images to the area 601 for one die is completed.

Next, a second embodiment of the present invention will be explained with reference to FIG. 10(a)–10(c). In this second embodiment, the arrangement of the small regions on the mask and a transferring method for transferring the small regions onto the beam-sensitive substrate are different from those in the first embodiment. The electron beam transferring apparatus used in the first embodiment is also used in this second embodiment. Thus, the electron beam transferring apparatus is referred to that shown in FIG. 6 and detailed explanation thereof will be omitted.

FIG. 10(a) shows a portion of a mask 70 according to the second embodiment, and FIG. 10(b) shows pattern images transferred to a beam-sensitive substrate by using the portion of the mask 70 shown in section (a) of FIG. 10. In order to transfer the patterns shown in section (b) of FIG. 10 onto the transfer areas A1, B1, C1, D1 along border lines LH1, LV1 independently, the mask 70 is provided with small regions 71A, 71B, 71C, 71D having electron beam permeable portions corresponding to the pattern images in the transfer areas A1, B1, C1, D1. Further, in order to transfer the patterns shown in section (b) of FIG. 10 onto the transferred areas A2, B2, C2, D2, E2 . . . , along border lines LH2, LV2 shown in FIG. 10(c) independently, the mask 70 is provided with small regions 72A, 72B, 72C, 72D, 72E, . . . , having electron beam permeable portions corresponding to the pattern images in the transferred areas A2, B2, C2, D2, E2 . . . .

When the exposure data for transferring the small regions on the mask 70 onto the beam-sensitive substrate is prepared, the small regions are grouped so that the small regions 71A, 71B, 71C, 71D are included in a first group and the small regions 72A, 72B, 72C, 72D, 72E, . . . , are included in a second group. In the transferring, firstly, the pattern images of the small regions included in the first group are transferred onto the beam-sensitive substrate by selectively illuminating these small regions successively. Then, the pattern images of the small regions included in the second group are transferred onto the beam-sensitive substrate by selectively illuminating these small regions successively. The dose amount of the electron beams for each illumination is set to half of the dose amount selected when the transferring is effected at once. By effecting the transferring operations in this way, the connection positions between the patterns in the first transferring and the connection positions between the patterns in the second transferring are different, thereby suppressing the error of the dose amount due to the poor alignment at the connection positions between the patterns. selection of the small region can be effected by adjusting the deflection amount of the deflectors 12. The adjustment of the transfer positions for the respective small regions can be effected by adjusting the deflection amount of the deflectors 13 and the position of the movable stage 21. When the pattern images transferred onto the beam-sensitive substrate by the combination of the small regions 71A, 71B, 71C, 71D and the small regions 72A, 72B, 72C, 72D, 72E, . . . , have a repeated feature, the pattern images of the combination of the small regions 71A, 71B, 71C, 71D and the small regions 72A, 72B, 72C, 72D, 72E, . . . , are transferred onto a plurality of positions on the beam-sensitive substrate. In this way, the dimension of the area including the small regions on the mask 70 can be reduced.

Next, a third embodiment of the present invention will be explained with reference to FIG. 11. The third embodiment concerns a repeat transferring method effective when land-shaped non-exposed patterns are generated on a beam-sensitive substrate.

Figure 11A:
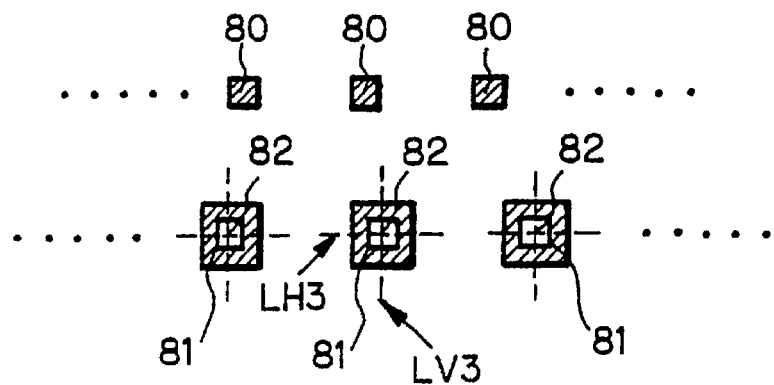
FIGS. 11(a)–11(c) are schematic illustrations showing a relation between patterns on a beam-sensitive substrate and small regions on a mask according to a third embodiment of the present invention.
Figure 11B:
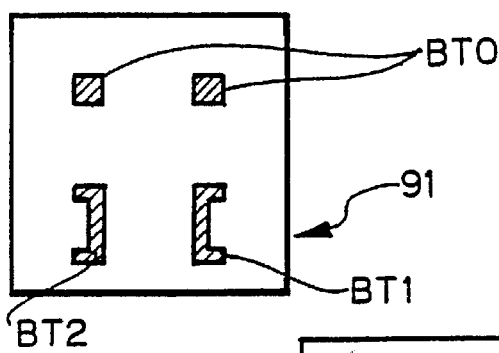
Figure 11C:
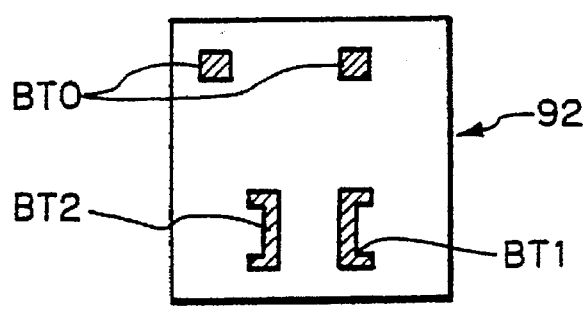
Figure 11D:
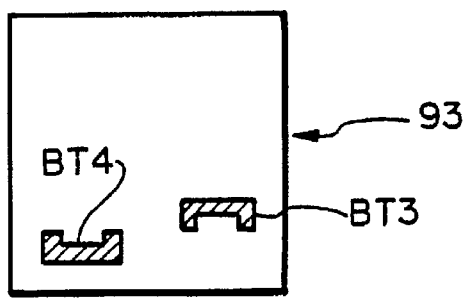
Figure 11E:
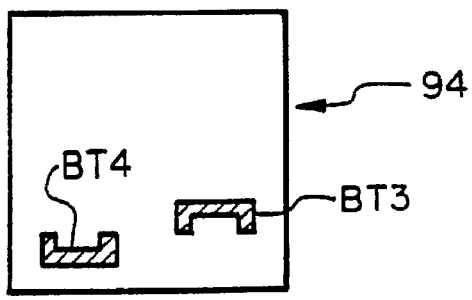

FIG. 11(a) shows a portion of a pattern according to the third embodiment to be transferred onto the beam-sensitive substrate. Hatched areas 80, 81 are exposure portions to be exposed by electron beams, and the reference numeral 82 denotes land-shaped non-exposed portions surrounded by the exposure portions 81. In case of the scattering mask shown in FIG. 9(a) and the stencil mask shown in FIG. 9(b), in order to form the non-exposed portions 82 on the beam-sensitive substrate, scattering portions BS having dimensions corresponding to the non-exposed portions must be provided. However, since the periphery of the scattering portion BS corresponding to the land-shaped non-exposed portion 82 is constituted by only thin film having no self-stand capability in case of the scattering mask, and since the periphery of the scattering portion BS corresponding to the land-shaped non-exposed portion 82 is surrounded by the vacancy in case of the stencil mask, in any case, the scattering portion BS corresponding to the land-shaped non-exposed portion 82 cannot be formed independently. To solve this problem, there has been proposed a technique in which patterns surrounding the land-shaped non-exposed portions 82 are divided into two and the divided patterns are transferred successively. However, in this embodiment of the present invention, the land-shaped non-exposed portions 82 are divided into four sections and the divided patterns are successively transferred.

FIGS. 11(b) to 11(e) show small regions on the mask for transferring the pattern shown in FIG. 11(a). Particularly, section (b) in FIG. 11 shows the small region 91 used in the first transferring, section (c) shows the small region 92 used in the second transferring, section (d) shows the small region 93 used in the third transferring, and section (e) shows the small region 94 used in the fourth transferring. The small regions 91, 92 are provided with electron permeable portions BT0 corresponding to the entire exposure portions 80 and electron permeable portions BT1, BT2 corresponding to the shapes of divided exposure portions 81 divided by a border line LV3. On the other hand, the small regions 93, 94 are provided with electron permeable portions BT3, BT4 corresponding to the shapes of divided exposure portions 81 divided by a border line LH3. The small regions 91–94 have the same dimension.

Regarding the mask having the above-mentioned small regions 91–94, the dose amount for each transferring is set to about ½ of the dose amount selected when the transferring is effected at once, and the pattern images of the small regions 91, 93 are transferred onto the same position on the beam-sensitive substrate and the pattern images of the small regions 92, 94 are transferred onto a position on the beam-sensitive substrate which is offset laterally by ½ of the width of the small regions 91, 93. By transferring the pattern images of the small regions 91, 92, the exposure portions 81 with border lines LV3 as connection positions are transferred to the beam-sensitive substrate, and, by transferring the pattern images of the small regions 93, 94, the exposure portions 81 with border lines LH3 as connection positions are transferred to the beam-sensitive substrate. Since the connection positions of the exposure portions 81 in the first and second transferring operations are different from the connection positions of the exposure portions 81 in the third and fourth overlapped transferring operations, the dose amount of the electron beams at each connection position of each exposure portion 81 is made even more effectively in comparison with the case where the exposure portion 81 is divided into two sections and the divided portions are merely transferred, thereby suppressing the error at the connection positions.

In the illustrated embodiment, while an example that exposure portions 81 are transferred twice in the superimposed fashion is explained, such superimposing transferring operations may be repeated three or more times.

When the total area of the pattern images within the transfer area on the beam-sensitive substrate (i.e., ratio of an area illuminated by the electron beams to the entire transfer area) is relatively great, the amount of the electron beam directed onto the beam-sensitive substrate during one transferring operation is increased, with the result that the transferred pattern image becomes dim due to the Coulomb effect. Also in this case, as is in the above-mentioned embodiment, the pattern can be divided into a plurality of pattern portions and the divided pattern portions are formed in the small regions on the mask, respectively. In this case, the pattern is divided into a plurality of pattern portions in such a manner that the pattern image of the divided pattern portion to be transferred onto the beam-sensitive substrate becomes sufficiently small in comparison with the entire transfer area (i.e., the area of the divided pattern portion (electron beam permeable portion) formed in each small region becomes sufficiently small). With this arrangement, it is possible to suppress the dimness of the pattern image of the divided pattern portion due to the Coulomb effect to a negligible extent. By selectively directing the electron beams onto the small regions on the mask successively, the pattern images of the divided pattern portions are transferred onto the beam-sensitive substrate while superimposing the pattern images with respect to all of the pattern portions or some of them. In this case, the dose amount of the electron beams is set to about ½ of the dose amount selected when the transferring is effected at once.

In this way, it is possible to transfer the good pattern images having no dimness due to the Coulomb effect onto the beam-sensitive substrate. Also in the illustrated embodiment, when the pattern to be transferred onto the beam-sensitive substrate are divided into a plurality of small regions, the small regions having the same shapes after division are represented by common small region(s), thereby omitting the remaining small regions having the same shapes to reduce the number of small regions on the mask. Accordingly, also in this embodiment, there is no problem caused by the numerous small regions for the whole area of a die.

Figure 20:
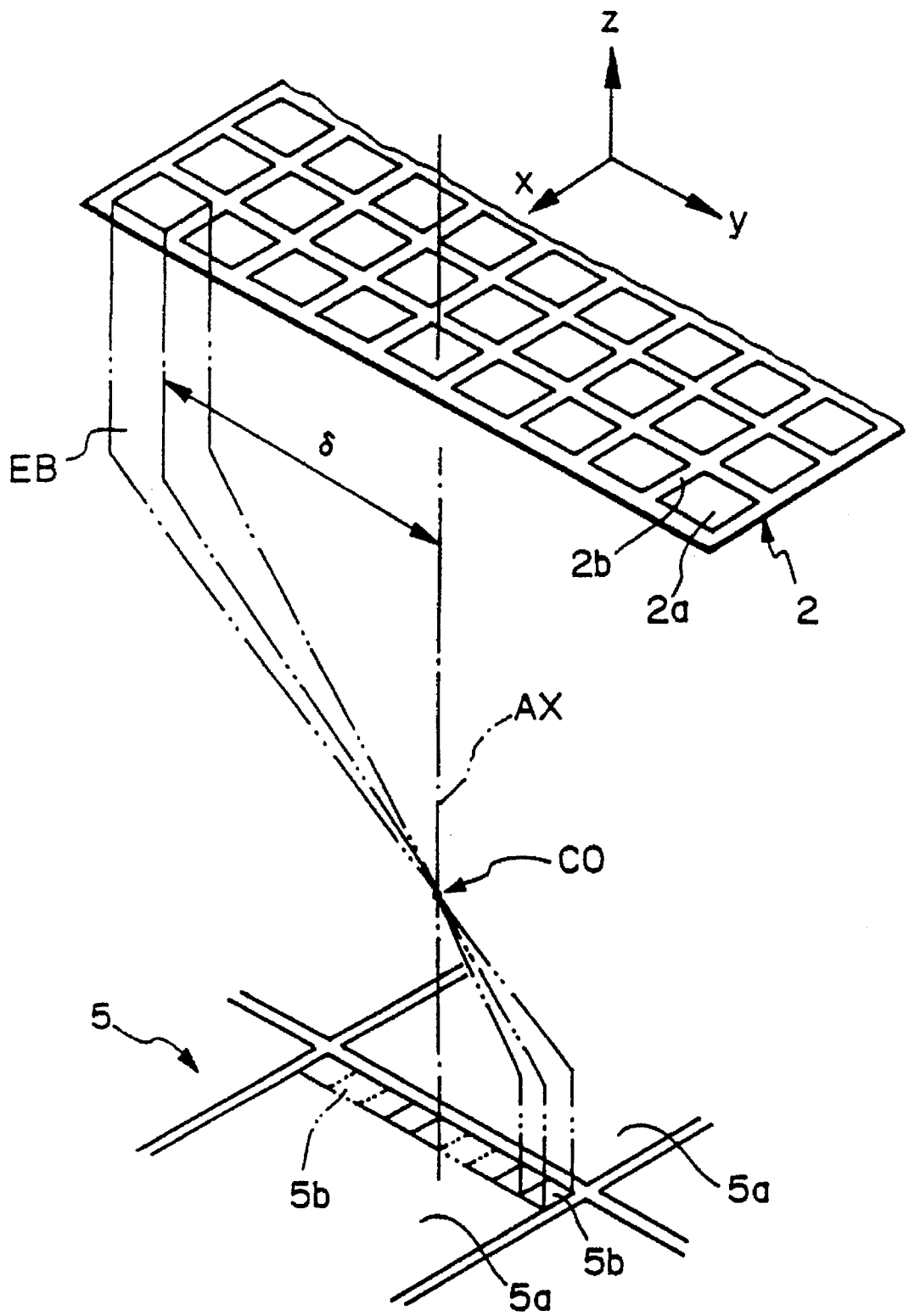
FIG. 20 is a view similar to FIG. 16, but is a schematic illustration showing a conventional technique slightly different from that of FIG. 16.

FIG. 20 is a view similar to FIG. 16, but shows another conventional example. According to this example, in a condition that a center of the mask 2 in the y-direction is aligned with the optical axis of the projection lenses 3, 4, the mask 2 and the wafer 5 are continuously shifted in opposite directions along the x-axis. In response to the continuous shifting movements of the mask and the wafer, the deflection amount $\delta$ of the electron beams EB in the y-direction given by the deflectors 1 is changed step-by-step, so that the electron beams EB are successively directed onto the small regions or pattern forming regions 2a arranged along the y-direction.

After the pattern images of a row of the pattern forming regions 2a arranged along the y-direction are transferred, the transferring operations are effected regarding the next row of the pattern forming regions 2a adjacent to the former row in the X-direction. Similarly, all of the pattern images corresponding to all of the forming regions 2a formed on the mask 2 are transferred onto the wafer 5. In this way, the transferring of the pattern to the area 5a for one die (on the wafer 5) is completed.

In the above-mentioned transferring method, the deflection amount (in the y-direction) of the electron beams EB passed through the mask 2 is increased as they go toward ends of the mask 2 in the y-direction. Thus, when the numerous pattern forming regions 2a are disposed side-by-side along the y-direction, the deflection amount is greatly increased, resulting in need for a high accurate controller. Further, if the deflection amount is increased, since distortion is increased accordingly, highly accurate deflectors are required for transferring the pattern forming regions disposed at the periphery of the mask 2 with substantially no distortion, which makes the entire apparatus expensive.

Next, a principle that the pattern image of the pattern forming region remote from the optical axis can be transferred onto the specimen with a small amount of deflection by using fourth and fifth embodiments of the present invention will be explained.

In FIGS. 12(a)–12(c) and 13, a mask 1010 includes pattern forming regions 1100 separated from one another by border zones 1101 for shielding the charged particle beams, and a pattern portion to be transferred onto a specimen 1020 is formed on each pattern forming region. By directing the charged particle beam onto the respective pattern forming regions 1100 successively, the pattern images of the pattern forming regions 1100 are projected onto the specimen 1020 through projection lenses 1057, 1058, and the charged particle beams passed through the mask 1010 are deflected so that transfer areas 1200 on the specimen 1020 corresponding to the respective pattern forming regions 1100 are contiguous to each other along one direction (y-direction) of the specimen 1020. The relationship between the plurality of pattern forming regions 1100 and the corresponding transfer areas 1200 on the specimen 1020 is determined in such a manner that the deflection amount of the charged particle beams passed through the mask 1010 in one direction (y-direction) of the specimen 1020 becomes minimum (for example, zero) when the charged particle beam is directed onto given pattern forming regions 1100F–1100J remote from the optical axis of the projection lenses 1057, 1058.

With the arrangement as mentioned above, when the charged particle beam is directed onto the given pattern forming regions 1100F–1100J remote from the optical axis of the projection lenses 1057, 1058, the deflection amount of the charged particle beams passed through the mask 1010 in one direction of the specimen 1020 becomes minimum or zero, with the result that the deflection amount of the charged particle beam passing through the mask 1010 is increased as they are spaced apart from the given pattern forming regions 1100F–1100J.

According to one aspect of the present invention, repeatable pattern portions to be transferred onto a plurality of positions on the specimen 1020 are formed on pattern forming regions 1100A–1100E on the mask 1010 which are positioned nearer to the optical axis of the projection lenses 1057, 1058 (i.e., nearer to a center line CLm) than the given pattern forming regions 1100F–1100J, and pattern images corresponding to these pattern portions on the pattern forming regions 1100A–1100E are transferred onto the plurality of positions 1200A–1200E on the specimen 1020.

With this arrangement, since the repeatable pattern portions formed on the pattern forming regions 1100A–1100E positioned nearer to the optical axis of the projection lenses 1057, 1058 than the given pattern forming regions 1100F–1100J are transferred onto the plurality of positions 1200A–1200E on the specimen 1020, the number of the pattern forming regions 1100 positioned nearer to the optical axis of the projection lenses 1057, 1058 than the given pattern forming regions 1100F–1100J can be reduced so that the given pattern forming regions 1100F–1100J can approach the optical axis of the projection lenses 1057, 1058 to positions where the deflection amounts of the charged particle beam passed through the given pattern forming regions 1100F–1100J become minimum (for example, zero).

According to another aspect of the present invention, the pattern to be transferred onto positions nearer the optical axis of the projection lenses 1057, 1058 (i.e. nearer to the center line CLm) than transfer areas 1200F–1200J (on the specimen 1020) corresponding to the given pattern forming regions 1100F–1100J (on the mask 1010) is divided into pattern portions which are formed on a plurality of rows of pattern forming regions 1100, 1100K–1100P, and, upon transferring, the pattern portions are transferred in such a manner that transfer areas 1200, 1200K–1200P corresponding to the plurality of rows of the pattern forming regions 1100, 1100K–1100P are contiguous to each other on the specimen 1020 along one direction (y-direction) of the specimen.

With this arrangement, since the patterns positioned nearer to the optical axis of the projection lenses 1057, 1058 than transfer areas 1200F–1200J (on the specimen 1020) corresponding to the given pattern forming regions 1100F–1100J are transferred by directing the charged particle beam onto the plurality of rows of the pattern forming regions 1100, 1100K–1100P, the number of the pattern forming regions 1100 positioned in the same row of the given pattern forming regions 1100F–1100J and nearer to the optical axis of the projection lenses 1057, 1058 can be reduced so that the given pattern forming regions 1100F–1100J can approach toward the optical axis of the projection lenses 1057, 1058 to positions where the deflection amounts of the charged particle beam passed through the given pattern forming regions 1100F–1100J become minimum or zero.

Next, an embodiment in which the present invention is applied to the transferring regarding a semiconductor wafer will be explained with reference to FIGS. 12(a)–12(c) to 14(a)–14(b). In these Figures, directions of x-axis, y-axis and z-axis are the same as those in FIG. 20.

FIGS. 12(a)–12(c) a correspondence relation between the mask 1010 and the wafer 1010 used in the fourth embodiment. Particularly, FIG. 12(a) shows a half of the mask 1010 positioned at one side of the center line CLm of the mask in the y-direction. The reference numeral 1100 denotes pattern forming regions; and 1101 denotes border zones separating the pattern forming regions 1100 from each other. Each pattern forming region 1100 is provided with a divided pattern portion to be transferred onto the wafer 1020 and has a square shape, one side of which has a length "La" The border zones 1101 each having a given width "Lb" are positioned between the pattern forming regions 1100. The dimensions of the pattern forming regions 1100 and the border zones 1101 may be determined in consideration of transferring accuracy and requested throughput. Detailed illustration of the pattern portions formed on the pattern forming regions 1100 is omitted.

FIG. 12(b) shows areas on the wafer 1020 onto which the pattern portions on the pattern forming regions 1100 shown in FIG. 12(a) are transferred in a desired combination. In FIG. 12(b), a square area 1200 which is encircled by the dot and chain lines and one side of which has a length "Lc" is a transfer area corresponding to one of the pattern forming regions 1100. These transfer areas 1200 are positioned in contact with each other in the y-direction by means of deflectors of the transferring apparatus which will be described later. Incidentally, in FIG. 12, while the pattern forming regions 1100 and the transfer areas 1200 are shown in the same scale, in reality, each transfer area 1200 is smaller than the corresponding pattern forming region 1100 by predetermined times corresponding to the reduction ratio (for example, ¼). The device to be formed on the wafer 1020 may be a memory device.

The symbol CLw denotes the center line of an area corresponding to one chip (die) on the wafer 1020 in the y-direction. Memory cells which have the same shape and which control the memory operation (storing operation) of the memory device are formed in a repeated pattern on an area F1 positioned between the center line CLw and the broken line (border line) BL. Peripheral circuits for the memory device are formed on a major part of an area F2 positioned outside of the border line BL, and bonding pads BPA and a dicing line DL are formed on an outer area F3. The area F1 requires the severe transferring accuracy, but the transferring accuracy of the area F2 is not so severe, and the transferring accuracy of the area F3 may be of the order of μm. In the illustrated embodiment, the number of transfer areas 1200 at one side of the center line CLw is forty.

A plurality of above-mentioned memory cells are formed on each transfer area 1200 in the area F1. For example, when the transfer area 1200 has a dimension of 250 μm×250 μm (Lc×Lc) and the memory cell has a dimension of 2.5 μm×2.5 μm, a number (10×10) of memory cells are formed on the single transfer area 1200. Since the transfer areas 1200 on which the memory cells are formed have the same transferred patterns, the pattern forming regions 1100 on the mask 1010 corresponding to such transfer areas have the same pattern portions. Accordingly, the memory cells can be formed on all of such transfer areas 1200 by using only one pattern forming region 1100 in case using least number of pattern forming regions.

In practice, since aberration in deflection is decreased as the deflection amount (in the y-direction) of the electron beam passed through the mask 1010 is decreased, a relation between the pattern forming areas 1100 and the transfer areas 1200 is selected so that the deflection amount (in the y-direction) of the electron beam is maintained within a predetermined acceptable range. In so selecting the relation, the center lines CLm, CLw are regarded as the optical axis of the projection lenses. That is to say, when it is assumed that the pattern portions of the pattern forming regions 1100 are transferred onto the wafer 1020 successively from the center line CLm in FIG. 12(a) toward the outside (the order of such transferring operations does not always the same as the actual transferring order), the pattern forming regions (hatched regions) 1100A–1100E are illuminated by the electron beam by two times, so that the pattern images of these pattern forming regions are transferred onto paired (adjacent in the y-direction) transfer areas 1200A–1200E, respectively. Numerical values −9–0–+3 shown in FIG. 12 indicate the deflection amounts (in the y-direction) of the electron beam when the pattern forming regions 1100 shown in FIG. 12(a) are transferred onto the transfer areas 1200 shown in FIG. 12(b), as values corresponding to the number of the border zones 1101. That is to say, when the width of the border zone 1101 is Lb, the numerical value "−9" indicates the fact that the electron beam should be deflected downwardly by an amount corresponding to 9×Lb, the numerical value "0" indicates the fact that the deflection amount of the electron beam is zero, and the numerical value "+3" indicates the fact that the electron beam should be deflected upwardly by an amount corresponding to 3×Lb. Incidentally, the symbol "−" indicates the required deflection toward the center lines CLm, CLw, and the symbol "+" indicates the required deflection away from the center lines CLm, CLw.

As apparent from FIG. 12(a)–12(c), since the pattern forming regions 1100A–1100E on the mask 1010 are used twice for one row of the transfer areas 1200 on the wafer 1020, the deflection direction of the electron beam is reversed at the pattern forming regions 1100A–1100E, with the result that, at positions spaced from the center lines CLm, CLw, there arise combinations of the pattern forming regions 1100F–1100J and the transfer areas 1200F–1200J in which the deflection amount of the electron beam becomes zero. In particular, since the deflection amount of the electron beam is zero when the pattern portion of the pattern forming region 1100J furthest from the optical axis of the projection lens in the area F1 is transferred onto the transfer area 1200J, the highly accurate transferring can be achieved without or with with little distortion.

Figure 13:
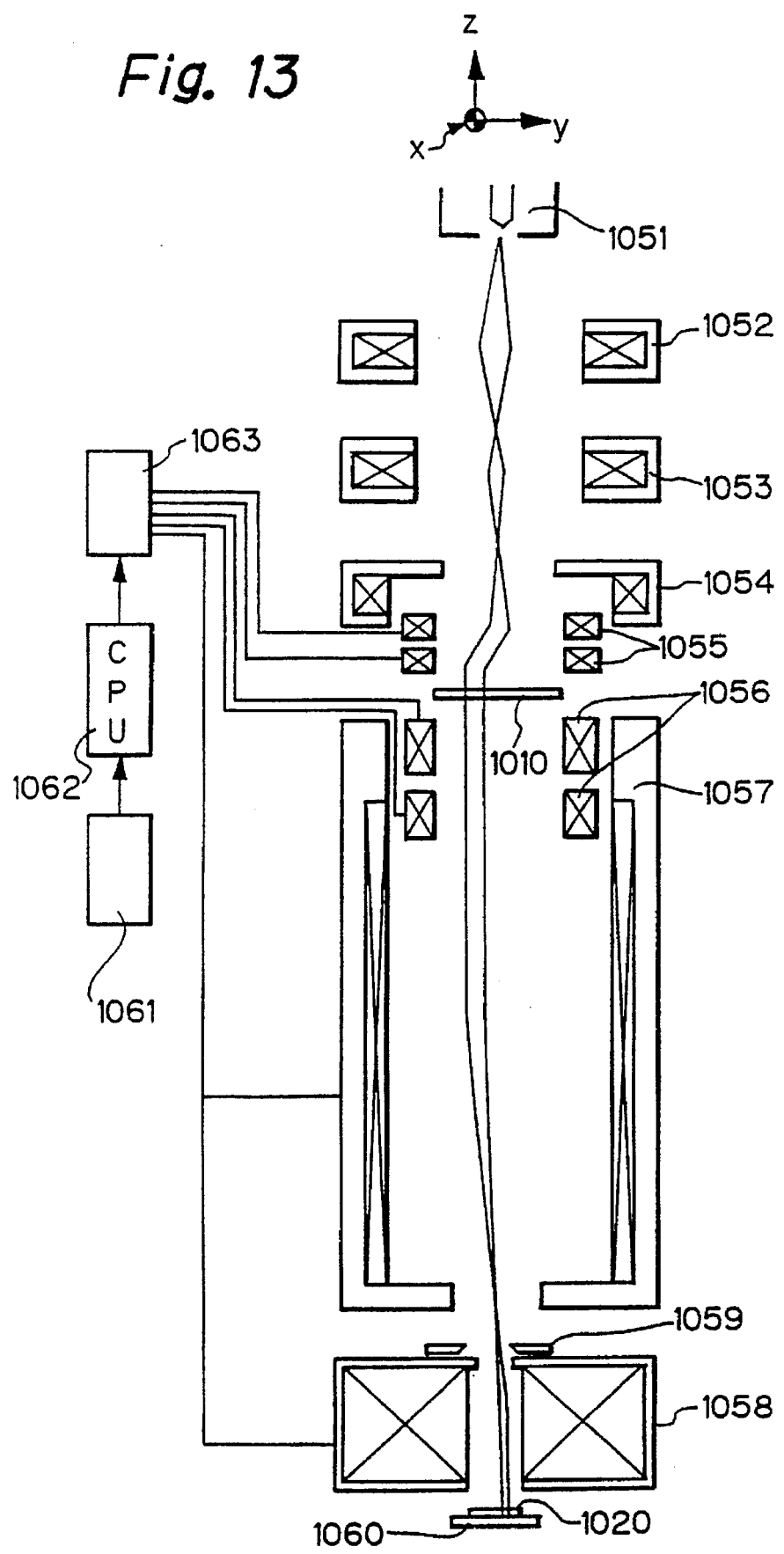
FIG. 13 is a schematic illustration showing an electron beam contraction transferring system which can be used in fourth and fifth embodiments of the present invention.

The transferring of the pattern from the mask 1010 to the specimen (wafer) 1020 is effected, for example, by using a transferring apparatus shown in FIG. 13. In FIG. 13, the reference numeral 1051 denotes an electronic gun; 1052, 1053, 1054 denote condenser lenses; 1055 denotes a field selection deflector for adjusting an illumination position of an electron beam EB regarding the mask 1010; 1056 denotes transfer position adjusting deflectors for adjusting a position of the electron beam EB passed through the mask 1010 and incident on the wafer 1020; 1057, 1058 denote projection lenses for projecting the pattern image on the mask 1010 onto the wafer 1020 with a reduction ratio; 1059 denotes a circular aperture; 1060 denotes a specimen support for shifting the wafer 1020 horizontally in the x-y plane; 1061 denotes a reader for reading transfer specification data written on the mask 1010; 1062 denotes a CPU for performing various calculations required for controlling operations of the deflectors 1055, 1056 and the projection lenses 1057, 1058 during the transferring on the basis of the read transfer specification data; and 1063 denotes an interface for transmitting signals between the CPU 1062 and the deflectors 1055, 1056 and the projection lenses 1057, 1058. In such an optical system, the above-mentioned deflection amounts shown in FIG. 12(a)–12(c) correspond to deflection amounts in the y-direction obtained by the deflectors 1056. During the transferring, the mask 1010 is continuously shifted in the x-direction (perpendicular to the plane of FIG. 13) by means of a mask stage (not shown), and the wafer 1020 is continuously shifted in the x-axis by the specimen support 1060 in a direction opposite to the mask 1010.

In the transferring apparatus having the above-mentioned arrangement, a correspondence relation between the pattern forming regions 1100 on the mask 1010 and the transfer areas 1200 on the wafer 1020, and the deflection amounts of the electron beam regarding each of the combinations of the pattern forming regions 1100 and the transferred areas 1200 are previously written on the mask 1010 as the transfer specification data. When the mask 1010 is mounted on the mask stage, the transfer specification data is read by the reader 1061, and the read data is stored in a memory provided in the CPU 1062. In the transferring, the deflection amount of the deflectors 1055 is controlled so that the electron beam EB is directed onto the pattern forming regions 1100 on the mask 1010 in a order or sequence written as the transfer specification data, and the deflection amount of the deflectors 1056 is controlled on the basis of the transfer specification data so that the pattern images of the pattern forming regions 1100 are transferred onto the predetermined positions on the wafer 1020.

The reduction effect of the deflection amount in the transferring as shown in FIG. 12(a)–12(c) will be calculated. In the example shown in FIG. 12(a)–12(c), since the maximum deflection amount is "−9", when it is assumed that the deflection amount corresponding to one border zone 1101 is 50 μm, the maximum deflection amount (in the y-direction) of the deflectors 1056 of FIG. 13 becomes ±450 μm (=±9×50 μm). To the contrary, as is in the conventional cases, if the deflection amount is determined by the total number of border zones 1101 from the center line CLw, when the pattern image is transferred onto the outermost transfer area 1200, the deflection amount becomes a maximum, which value is 1950 μm (=50 μm×39). In this way, according to the example of FIG. 12(a)–12(c), the maximum deflection amount can be reduced to ¼ or less in comparison with that of the conventional case. In addition, the accuracy of the deflectors 1056 may be ±1/15000 (=±0.01 μm/(3×50 μm)), and, thus, since the accuracy of 14 bits is acceptable, the deflectors can be controlled with high speed DAC. Furthermore, since the number of the pattern forming regions 1100 is reduced by five on each side of the center line CLm in comparison with the conventional case, the width of the mask 1010 in the y-direction can be reduced by about 3 mm (=5×300 μm×2), taking the widths of the border zones 1101 into account as well.

In the above-mentioned embodiment, as shown in FIG. 12(a)–12(c), while an example that the deflection amount of the electron beam is zero when the pattern image of the pattern forming region 1100J furthest from the optical axis of the projection lenses is explained, such a deflection amount may not be zero, but may be ±0.5×Lb, for example. In this case, the deflection amounts (in the y-direction) of the electron beam when the pattern forming regions 1100 shown in FIG. 12(a) are transferred onto the transfer areas 1200 are shown in FIG. 12(c) in the same manner as that shown in FIG. 12(b). In this case, the accuracy of the deflectors 1056 may be ±1/12500 (=±0.01 μm/(2.5×50 μm)), and, thus, the deflectors can be controlled with high speed DAC.

Figure 14B:
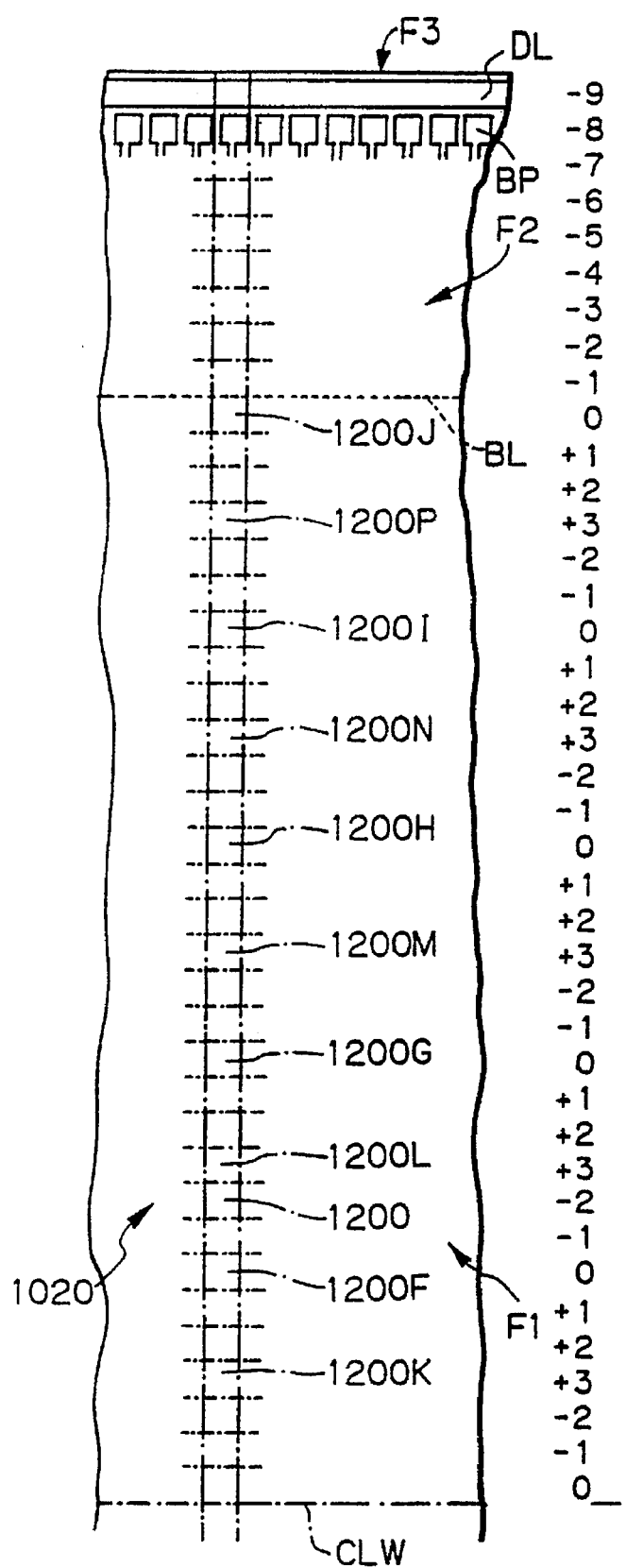
FIGS. 14(a) and 14(b) are schematic illustrations showing a relation between a mask and a wafer according to the fifth embodiment.
Figure 14A:
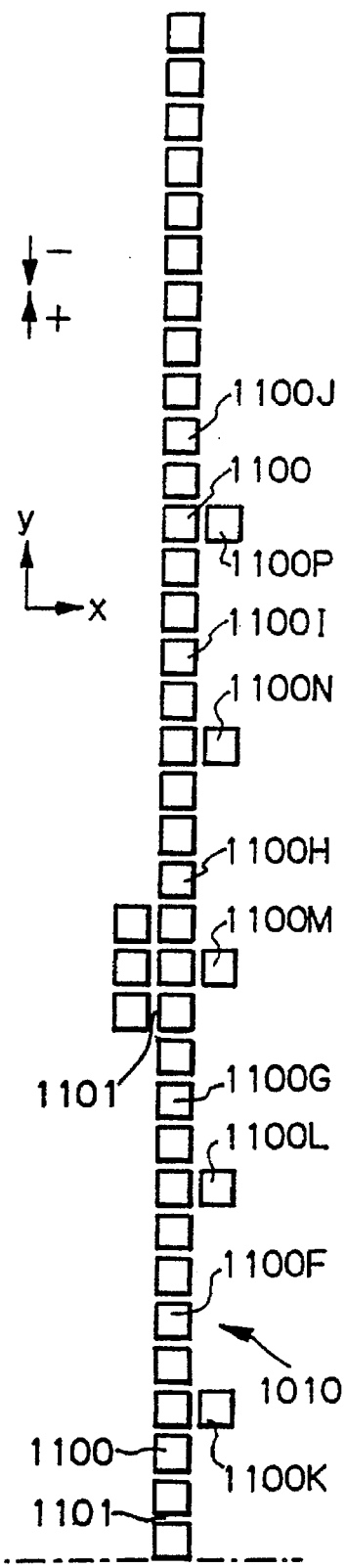

FIGS. 14(a) and (b) show a relation between the mask 1010 and the wafer 1020 used in the fifth embodiment. FIGS. 14(a) and 14(b), the same elements as those in FIGS. 12(a)–12(c) are designated by the same reference numerals. In the fifth embodiment, any pattern forming regions 1100 on the mask 1010 are not used as a common region to a plurality of transfer areas 1200 on the wafer 1020 so that the pattern forming regions 1100 correspond to the transfer areas 1200 on the wafer 1020 at a ratio of 1:1. However, the pattern forming regions 1100 corresponding to one row of the transfer areas 1200 on the wafer 1020 are disposed on the mask 1010 in two rows. More specifically, the pattern forming regions 1100K–1100P are disposed on the mask in a row adjacent to a row of the remaining pattern forming regions 1100 in the x-direction.

Upon the transferring the pattern images of one row of the pattern forming regions 1100, the transfer areas 1200K–1200P corresponding to the pattern forming regions 1100K–1100P remain in a non-exposed condition, and, when pattern forming regions 1100K–1100P are moved to the alignment with the optical axis of the projection lenses in the x-direction by continuously shifting the mask 1010 and the wafer 1020 in the x-direction, the deflection amount of the deflectors 1056 is adjusted so that the pattern images of the pattern forming regions 1100K–1100P are transferred onto the transfer areas 1200K–1200P by successively directing the electron beam onto the pattern forming regions 1100K–1100P.

As mentioned above, since the pattern forming regions 1100 corresponding to the transfer areas 1200 disposed on the wafer 1020 in one row are disposed on the mask in two rows, the deflection direction of the electron beam is reversed at the transfer areas 1200K–1200P corresponding to the pattern forming regions 1100K–1100P, with the result that, at positions spaced from the center lines CLm, CLw, there arise combinations of the pattern forming regions 1100F–1100J and the transfer areas 1200F–1200J in which the deflection amount of the electron beam becomes zero. Thus, as is in the fourth embodiment, the high accurate transferring can be achieved even at the positions spaced from the optical axis. Particularly, in this embodiment, since the pattern forming regions 1100 correspond to the transfer areas 1200 at the ratio of 1:1, this embodiment can also be applied to a case where devices not including repeated patterns, such as memory cells, are manufactured.

What is claimed is:

1. A method of transfer with a charged particle beam for transferring a predetermined pattern onto a predetermined area on a substrate, wherein said pattern to be transferred to said predetermined area on said substrate is divided into a plurality of small regions spaced apart from each other on a mask, said method comprising the steps of:

repeatedly directing a charged particle beam to said small regions on said mask, with each small region being treated as a unit of projection with the beam; and adjusting pattern transfer positions so that transfer areas corresponding to said small regions contact each other on said substrate, wherein said pattern to be transferred to said predetermined area on said substrate is divided into a plurality of small regions, the small regions having the same pattern portion after division are represented by a common small region and, upon transferring, the pattern of said common small region is transferred onto a plurality of positions on said substrate.

2. A method of transfer according to claim 1, wherein a mask side optical field of an optical system used in the transferring is set to be smaller than the mask side optical field which would be required when said common small region is not used.

3. A method of transfer according to claim 1, wherein said predetermined area on said substrate is set to be greater than a substrate side optical field of a charged particle beam type transferring apparatus in one direction of said substrate, and, upon transferring, said small regions on said mask are transferred onto said predetermined area on said substrate by shifting said substrate in said one direction.

4. A method of transfer according to claim 1, wherein said predetermined area on said substrate is set to be included within a substrate side optical field of a charged particle beam type transferring apparatus and the pattern to be transferred onto said predetermined area is divided into small regions disposed in a range greater than a mask side optical field of said charged particle beam type transferring apparatus in one direction of said mask, and wherein, upon transferring, pattern portions of said small regions of said mask are transferred onto said predetermined area on said substrate by shifting said mask in said one direction.

5. A method of transfer according to claim 1, wherein said predetermined area on said substrate is set to be greater than a substrate side optical field of a charged particle beam type transferring apparatus in one direction of said substrate and the pattern to be transferred onto said predetermined area is divided into small regions disposed in a range greater than a mask side optical field of said charged particle beam type transferring apparatus in one direction of said mask, and wherein, upon transferring, pattern portions of said small regions of said mask are transferred onto said predetermined area on said substrate by shifting said mask in said one direction of said mask and shifting said substrate in said one direction of said substrate.

6. A method of transfer with a charged particle beam for transferring a predetermined pattern onto a predetermined area on a substrate, wherein said pattern to be transferred to said predetermined area on said substrate is divided into a plurality of small regions spaced apart from each other on a mask said method comprising the steps of:

repeatedly directing a charged particle beam to said small regions on said mask, with each small region being treated as a unit of projection with the beam; and adjusting pattern transfer positions so that transfer areas corresponding to said small regions are contacted with each other on said substrate, wherein the transferring of the pattern to said substrate is effected in a superimposed fashion by at least twice for at least a portion of said substrate and, between repeated transferring steps for superimposing, border positions of the respective pattern portions are different from each other.

7. A method of transfer according to claim 6, wherein, when said pattern to be transferred to said predetermined area on said substrate is divided into a plurality of small regions, the small regions having the same pattern portion after division are repeated by a common small region, and, upon transferring, the pattern of said common small region is transferred onto a plurality of positions on said substrate.

8. A mask used for transfer with a charged particle beam, comprising:

a pattern to be transferred to a predetermined area on a substrate, said mask being divided into a plurality of small regions spaced apart from each other, the pattern to be transferred to said predetermined area on said substrate comprising:

a first pattern component including a first group of small regions divided at a first border position; and a second pattern component having the same shape as the first component and including a second group of small regions divided at it second border position different from said first border position.

9. A method of transfer with a charged particle beam wherein a mask on which a pattern to be transferred to a specimen is divided into a plurality of small regions by border zones for blocking a charged particle beam, said method comprising the steps of: projecting a pattern image of each small region onto said specimen through a projection lens while successively directing the charged particle beam on said small regions; and deflecting the charged particle beam passing through said mask so that the pattern images projected on said specimen are contiguous to each other in one direction on said specimen, wherein a relation between a plurality of small regions and the corresponding pattern images projected on said specimen is selected so that, when the charged particle beam is directed on a given small region spaced apart from an optical axis of said projection lens, a deflection amount of the charged particle beam passing through said mask becomes minimum along said one direction on said specimen.

10. A method of transfer according to claim 9, wherein a repeatable pattern portion is provided on a small region nearer said optical axis of said projection lens than said given small region on said mask, and said repeatable pattern portion is transferred onto a plurality of positions on said specimen.

11. A method of transfer according to claim 9, wherein the pattern to be transferred onto a position nearer said optical axis of said projection lens than the transfer area on said specimen corresponding to said given small region on said mask is divided into a plurality of small regions arranged in a plurality of rows, and the transferring is effected so that the transfer areas corresponding to said small regions of a plurality of rows are contiguous to each other on said specimen along said one direction.

* * * * *